United States Patent
Inoue et al.

(10) Patent No.: US 7,554,139 B2
(45) Date of Patent: Jun. 30, 2009

(54) SEMICONDUCTOR MANUFACTURING METHOD AND SEMICONDUCTOR DEVICE

(75) Inventors: Akira Inoue, Osaka (JP); Haruyuki Sorada, Osaka (JP); Yoshio Kawashima, Osaka (JP); Takeshi Takagi, Kyoto (JP)

(73) Assignee: Panasonic Corporation, Kadoma (JP)

( * ) Notice: Subject to any disclaimer, the term of this patent is extended or adjusted under 35 U.S.C. 154(b) by 368 days.

(21) Appl. No.: 11/568,404

(22) PCT Filed: Apr. 11, 2005

(86) PCT No.: PCT/JP2005/007031

§ 371 (c)(1),
(2), (4) Date: Oct. 27, 2006

(87) PCT Pub. No.: WO2005/106949

PCT Pub. Date: Nov. 10, 2005

(65) Prior Publication Data

US 2008/0135877 A1 Jun. 12, 2008

(30) Foreign Application Priority Data

Apr. 30, 2004 (JP) .............................. 2004-135760

(51) Int. Cl.
*H01L 29/76* (2006.01)
*H01L 21/336* (2006.01)
(52) U.S. Cl. .................. 257/288; 257/289; 257/368; 257/E27.06; 257/E21.131; 438/197; 438/285; 438/442
(58) Field of Classification Search ................. 257/192, 257/285, E27.06, E21.131, 288, 289, 368; 438/192, 285, 442, 197, 296
See application file for complete search history.

(56) References Cited

U.S. PATENT DOCUMENTS 5,885,856 A 3/1999 Gilbert et al.

(Continued)

FOREIGN PATENT DOCUMENTS

| JP | 63-236313 | 10/1988 |
|----|-----------|---------|
| JP | 02-228025 | 9/1990 |
| JP | 05-275618 | 10/1993 |
| JP | 11-016999 | 1/1999 |
| JP | 2000-031481 | 1/2000 |
| JP | 2004-055824 | 2/2004 |

OTHER PUBLICATIONS

International Search Report for corresponding Application No. PCT/JP2005/007031 mailed Jul. 26, 2005.

*Primary Examiner*—Tuan N. Quach
(74) *Attorney, Agent, or Firm*—Renner, Otto, Boiselle & Sklar, LLP

(57) ABSTRACT

A production method for a semiconductor device according to the present invention includes: step (A) of providing a substrate including a semiconductor layer having a principal face, the substrate having a device isolation structure (STI) formed in an isolation region 70 for partitioning the principal face into a plurality of device active regions 50, 60; step (B) of growing an epitaxial layer containing Si and Ge on selected device active regions 50 among the plurality of device active regions 50, 60 of the principal face of the semiconductor layer; and step (C) of forming a transistor in, among the plurality of device active regions 50, 60, each of the device active regions 50 on which the epitaxial layer is formed and each of the device active regions A2 on which the epitaxial layer is not formed. Step (A) includes step (a1) of forming, in the isolation region 70, a plurality of dummy regions 80 surrounded by the device isolation structure (STI), and step (B) includes step (b1) of growing a layer of the same material as that of the epitaxial layer on selected regions among the plurality of dummy regions 80.

24 Claims, 15 Drawing Sheets

U.S. PATENT DOCUMENTS

| | | | |
|---|---|---|---|
| 7,112,495 B2 * | 9/2006 | Ko et al. | 438/300 |
| 7,411,302 B2 * | 8/2008 | Kuroda et al. | 257/758 |
| 2001/0026992 A1 * | 10/2001 | Mori et al. | 438/424 |
| 2002/0061608 A1 | 5/2002 | Kuroda et al. | |
| 2008/0079088 A1 * | 4/2008 | Kudo | 257/384 |
| 2008/0194070 A1 * | 8/2008 | Shih et al. | 438/285 |
| 2008/0296700 A1 * | 12/2008 | Kang | 257/390 |

* cited by examiner

FIG.1
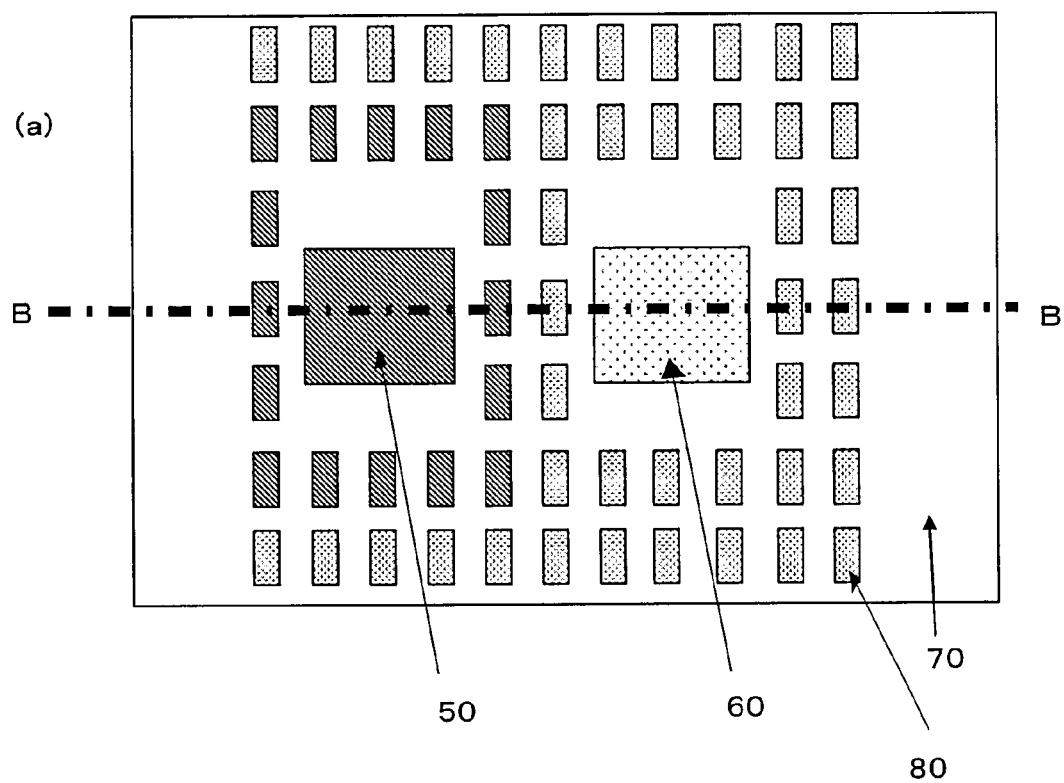
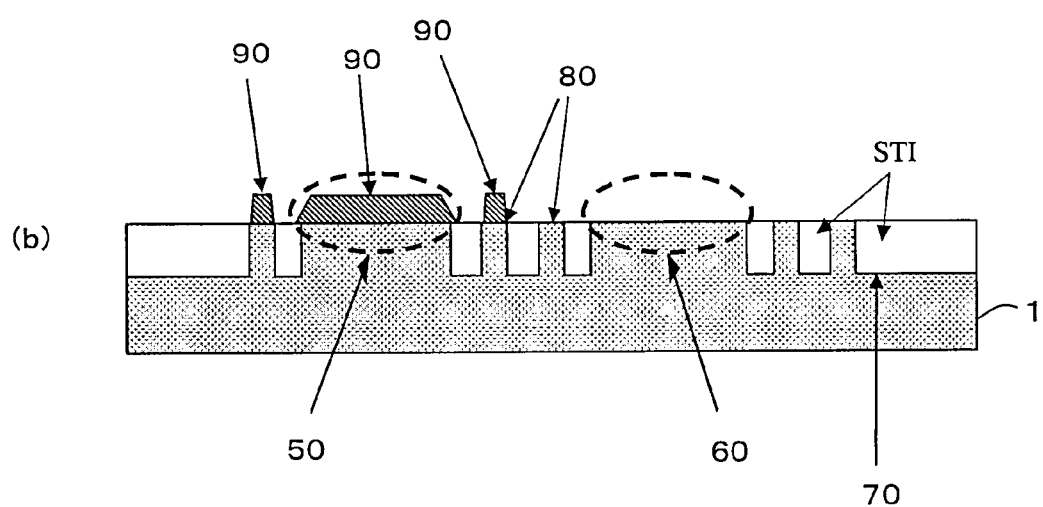

FIG.6
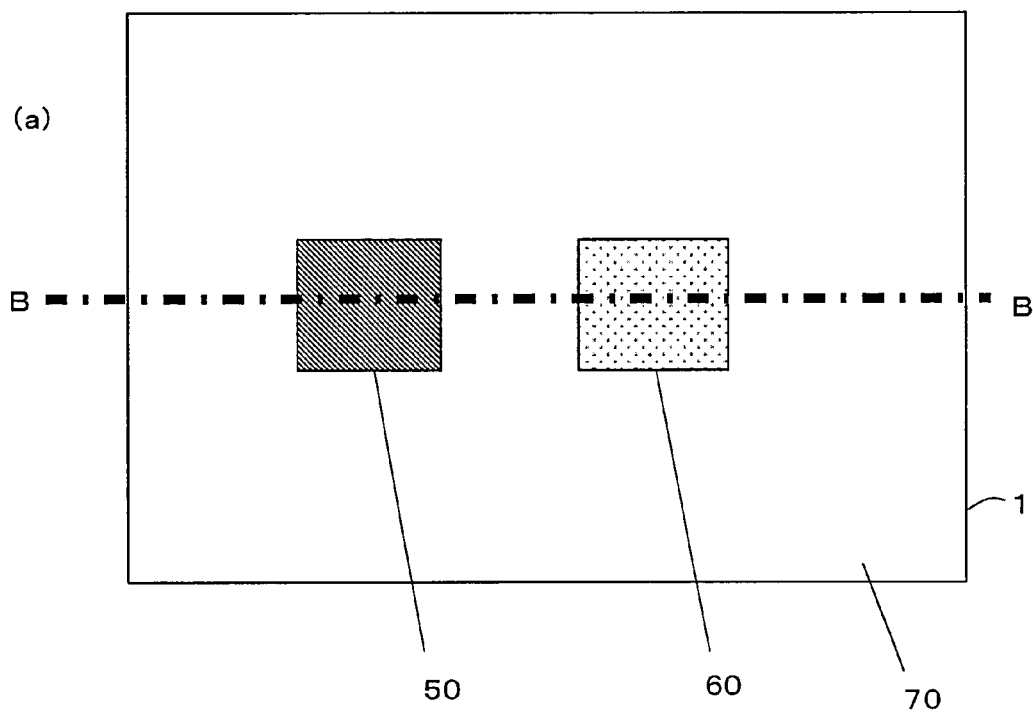
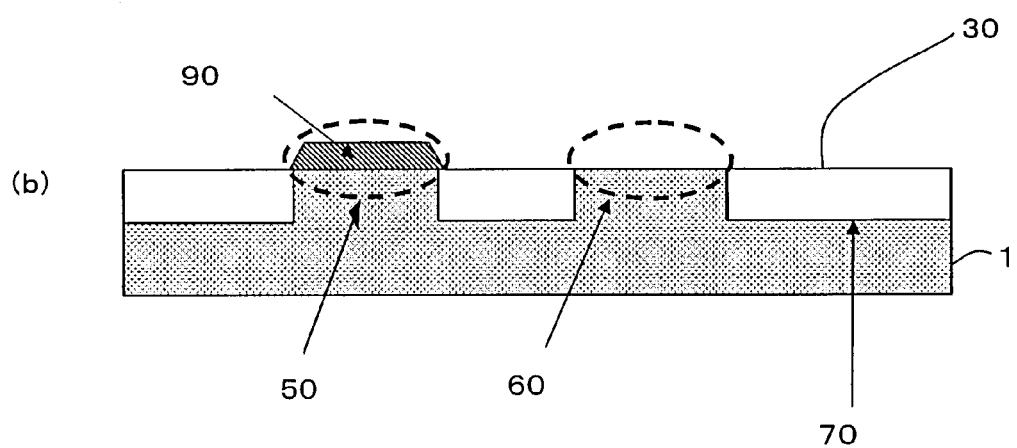

FIG.7
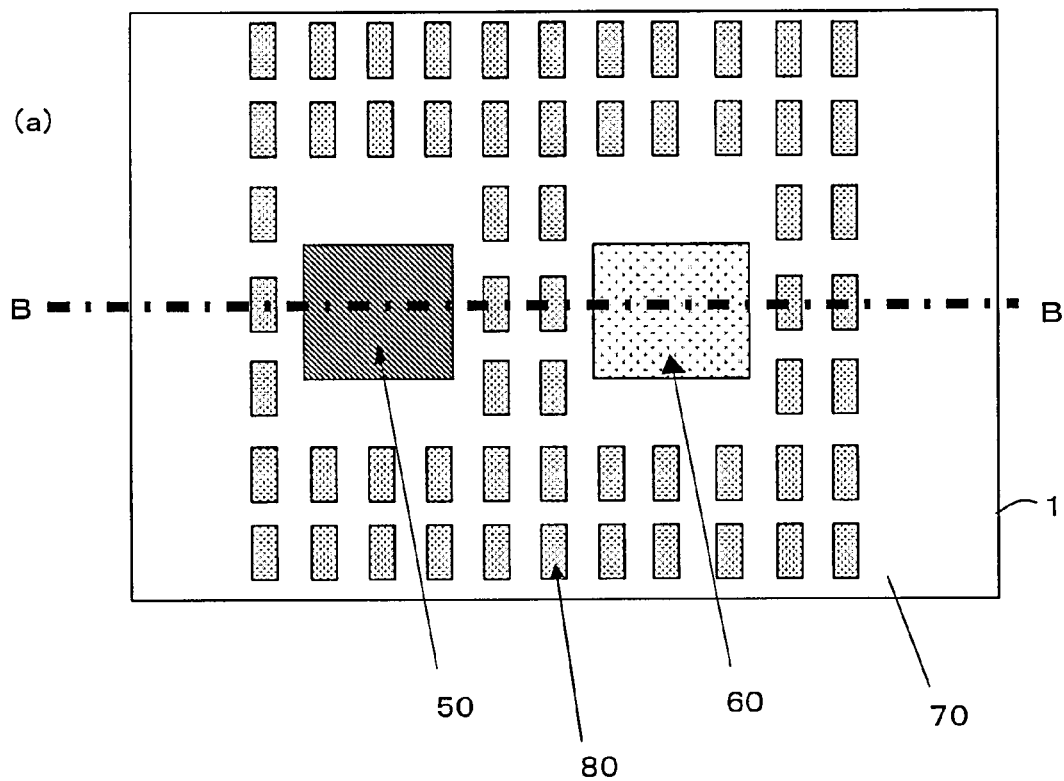
(a)
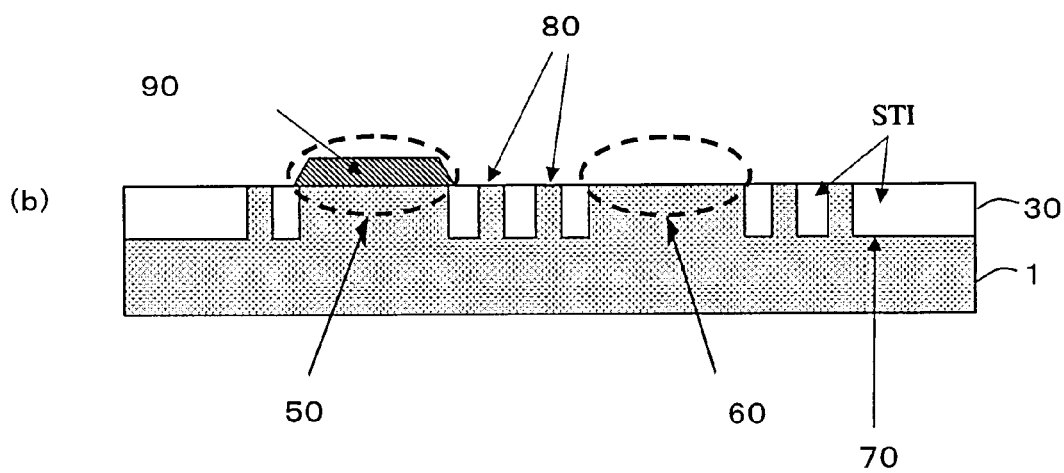
(b)

FIG.9
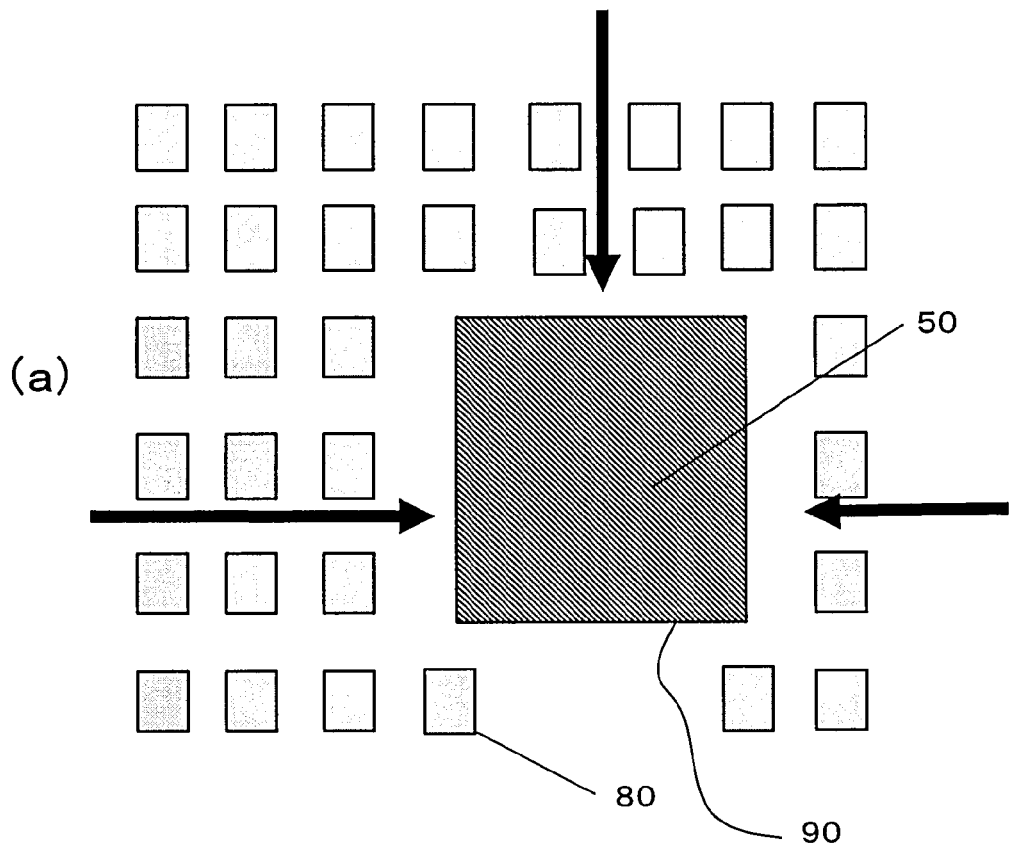
(a)
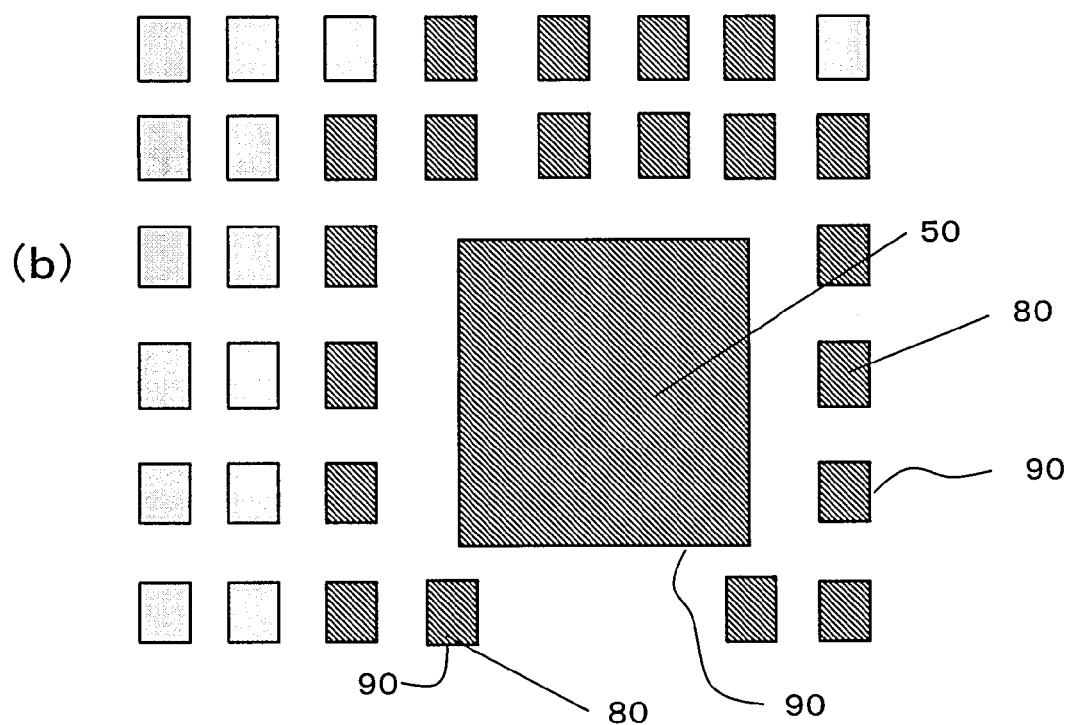
(b)

FIG.10
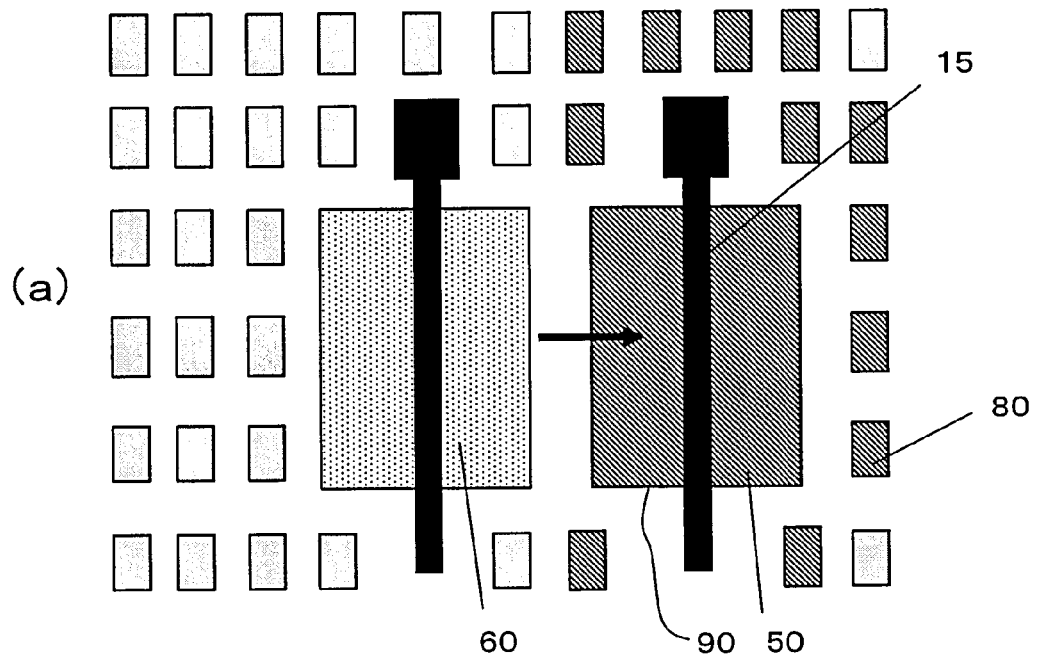
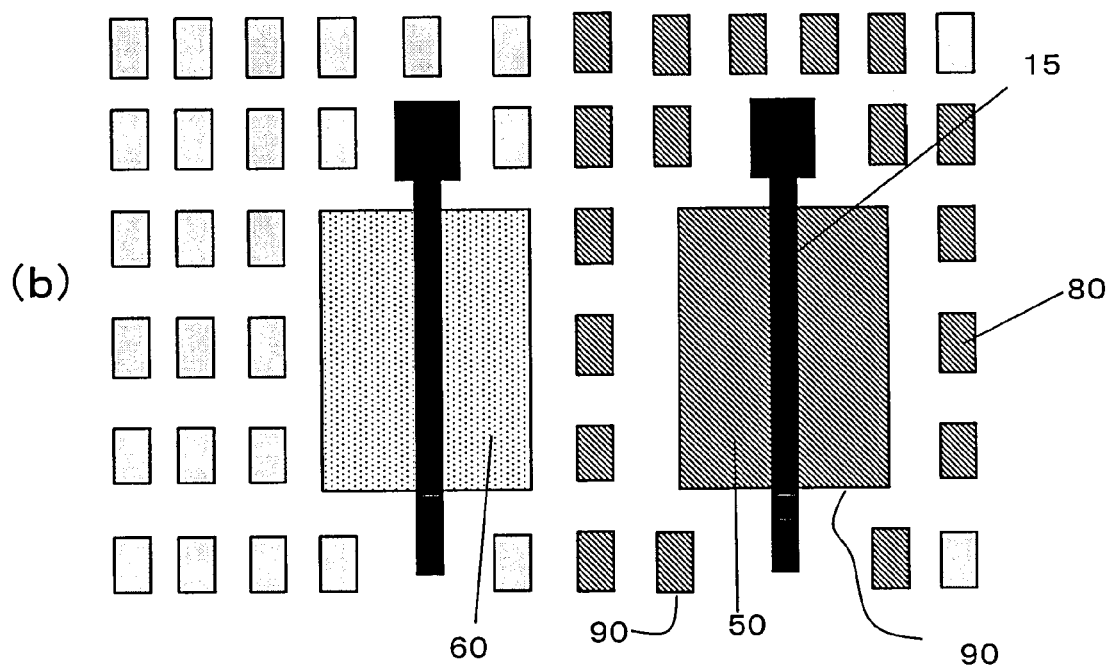

*FIG.12*
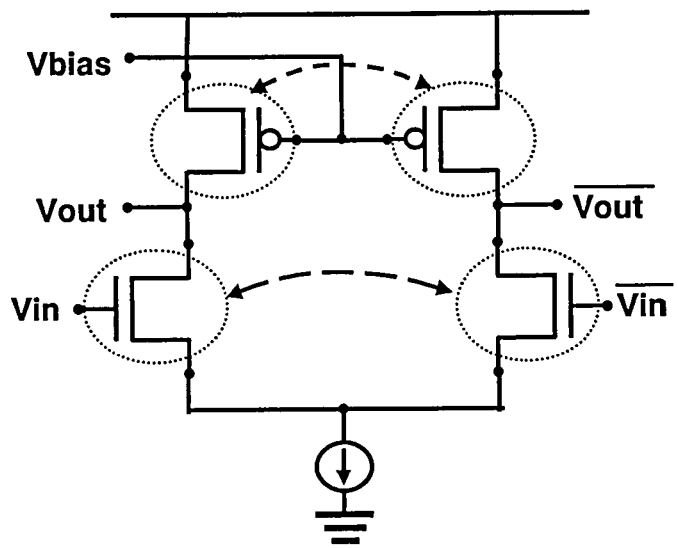
(a)
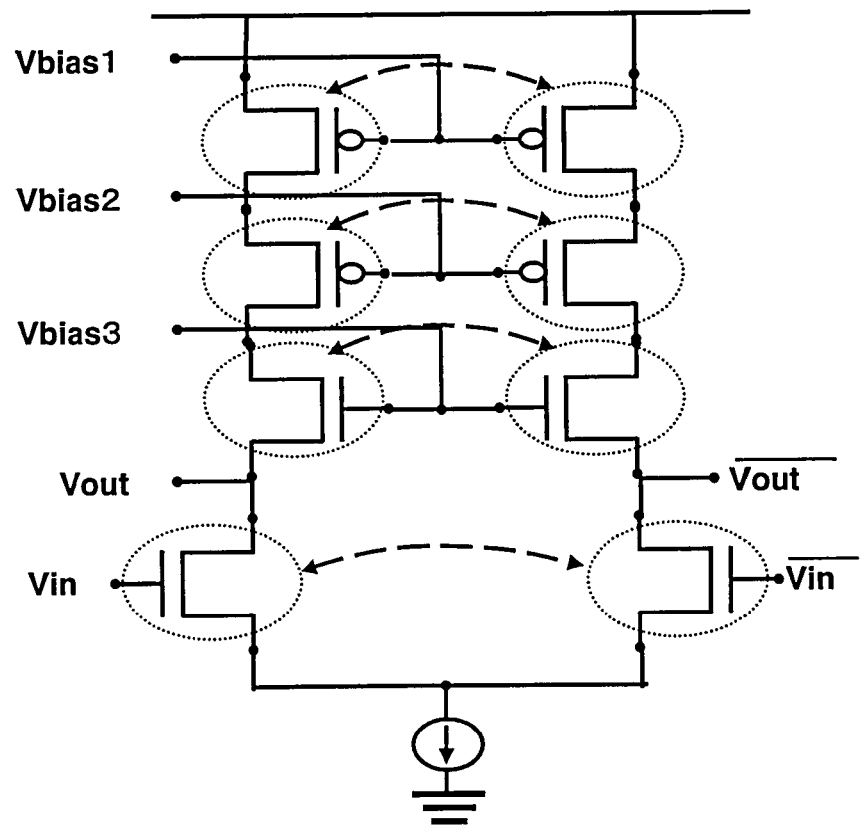
(b)

*FIG.13*
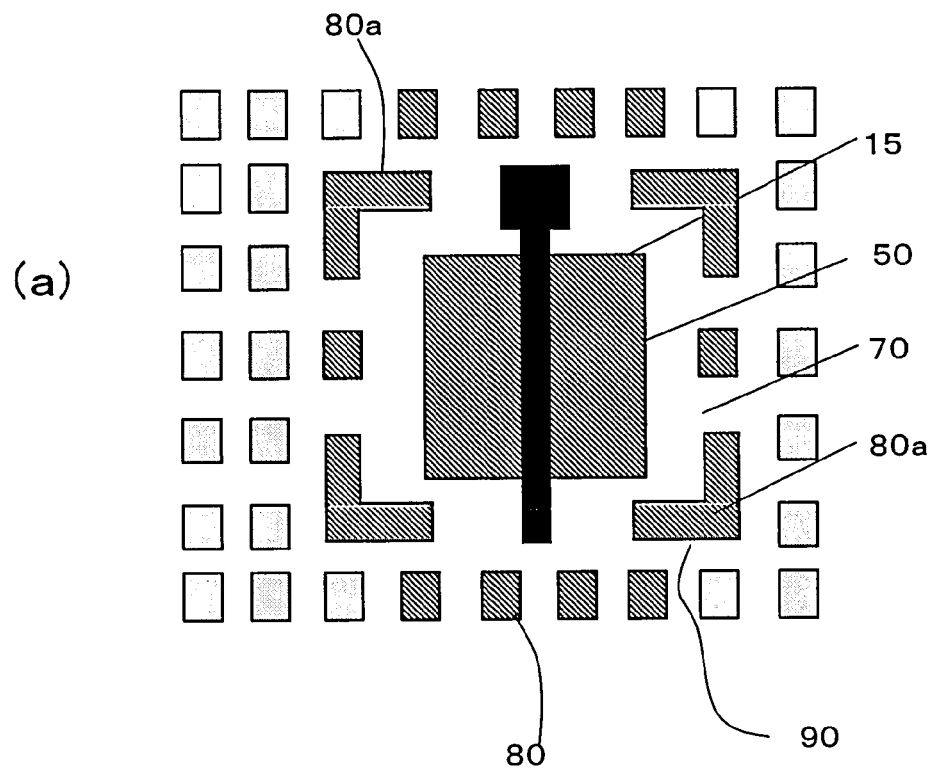
(a)
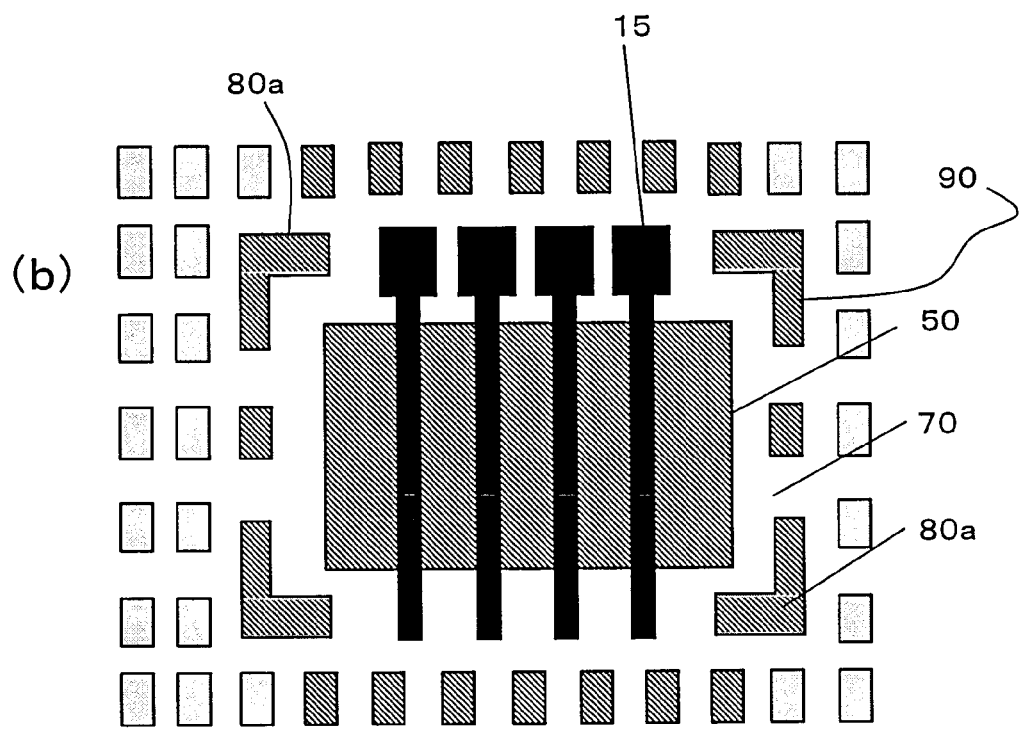
(b)

*FIG.14*
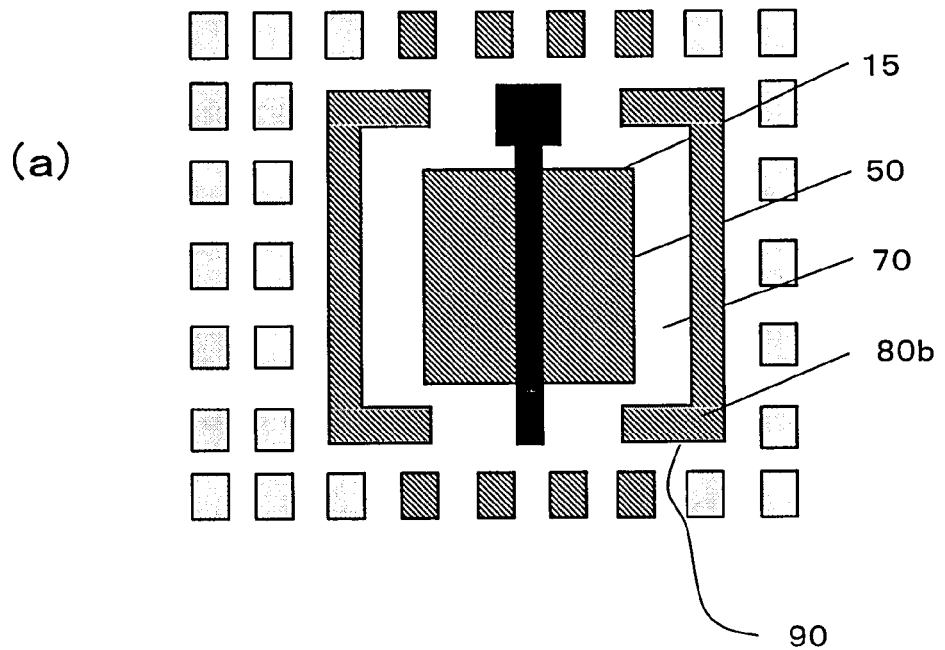
(a)
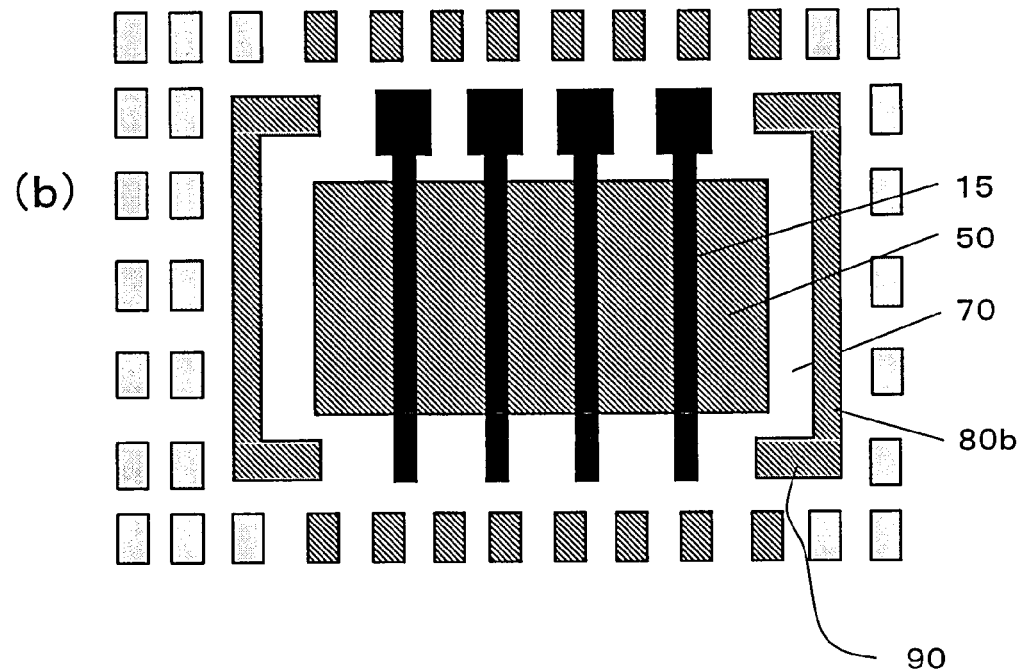
(b)

SEMICONDUCTOR MANUFACTURING METHOD AND SEMICONDUCTOR DEVICE

TECHNICAL FIELD

The present invention relates to a semiconductor device, a production method, and a designing method, in which an SiGe-containing semiconductor layer is selectively epitaxially-grown in a selected region of a substrate.

BACKGROUND ART

Semiconductor devices which employ SiGe are being vigorously studied to attain goals such as reduction of power consumption and enhancement of operation speed in semiconductor devices. By using an SiGe layer as a channel, hole mobility can be improved about twofold over that in a conventional silicon layer. Studies of strained Si technology are also in progress. By using a strained Si layer as a channel layer, an about 2.2 times improvement in electron mobility, and an about 1.4 times improvement in hole mobility, can be realized over that of a conventional silicon layer. Such a strained Si layer can be obtained by growing an Si layer on a lattice-relaxed SiGe layer. Since SiGe crystal has a slightly larger lattice mismatch than that of Si (the lattice constant of an SiGe layer having a 30% Ge composition is about 1% greater than the lattice constant of a silicon layer), tensile strain will occur in the Si which is grown on SiGe.

The inventors have studied development of a semiconductor device in which a semiconductor layer including an SiGe layer is selectively epitaxially-grown in specific regions of an Si substrate, such that usual Si MOS transistors (Si devices) and SiGe MOS transistors (SiGe devices) coexist on a single Si substrate.

In order to allow such MOS transistors whose channel regions differ in semiconductor composition to coexist on a single Si substrate, it is necessary to grow an SiGe layer in selected regions of the Si substrate, uniformly and with a good reproducibility.

With reference to FIGS. 6(a) and (b), a basic method for growing an SiGe layer on a selected region will be described. FIG. 6(a) is a plan view showing a portion of a principal face of an Si substrate 1, where device active regions 50 and 60 and an isolation region 70 are illustrated. FIG. 6(b) is a cross-sectional view taken at line B-B in FIG. 6(a).

As can be seen from FIGS. 6(a) and (b), on the principal face of the Si substrate 1, an SiGe-containing layer is epitaxially grown on the surface of the device active region 50, whereas nothing is grown on the surface of the device active region 60. Moreover, the device active regions 50 and 60 are within the surrounding isolation region 70. In the device active region 50, an MOS transistor (SiGe device) which utilizes the SiGe-containing layer as an active region is formed through subsequent production steps (not shown). In the device active region 60, an MOS transistor (Si device) which utilizes the surface region of the Si substrate 1 as an active region is formed.

In the isolation region 70, as shown in FIG. 6(b), a recess or trench whose interior is filled with an insulator 30 is formed. The level of the substrate principal face (Si surface) in the isolation region 70 is lower than the level of the substrate principal face (Si surface) in the device active regions 50 and 60. Such a device isolation structure, comprising the insulator 30 which fills a device isolation trench that is formed in the Si substrate 1, is called STI (Shallow Trench Isolation). The device active regions 50 and 60 are electrically separated from each other by this STI.

Only two device active regions 50 and 60 are illustrated in FIGS. 6(a) and (b) for simplicity. A multitude of device active regions 50 and 60 are to be formed on an actual Si substrate.

Before the SiGe-containing layer is epitaxially grown on the device active region 50, a selective-growth mask (not shown) which completely covers the surface of the device active region 60 is formed. The selective-growth mask has an aperture formed therein, such that the device active region 50 is left exposed through this aperture immediately prior to epitaxial growth. Under selective epitaxial conditions, the SiGe-containing layer will grow its crystal on the Si surface, while not growing on the selective-growth mask. Therefore, the SiGe-containing layer is selectively grown on the device active region 50, as shown in FIG. 6(b).

Note that, in order to form STI, an insulating film such as $SiO_2$ is deposited so as to fill a device isolation trench which is formed on the surface of the Si substrate 1, and thereafter a treatment of planarizing the upper face of the insulating film by CMP (Chemical Mechanical Polishing) is performed. When performing such CMP, there may emerge differences in polishing amount within the isolation region 70, between portions having broader areas and portions having narrower areas, thus hindering a uniform planarization treatment. Such a phenomenon is called "dishing", where the polishing amount varies depending on the pattern size or area ratio. In order to solve the dishing problem, as shown in FIGS. 7(a) and (b), it is practiced to form a plurality of dummy regions 80 within the isolation region 70 (Patent Document 1, for example). The dummy regions 80 are formed with the purpose of substantially uniformizing the trench width of the STI across the wafer or within the chip, thus ensuring that polish by CMP will uniformly progress in the wafer. Therefore, although the dummy regions 80 are positioned in portions of the region where a recess (as the isolation region 70) is to be formed, no recesses are formed in such portions. As a result, the Si surface of the dummy regions 80 is maintained at the same level as that of the Si surface of the device active regions 50 and 60. However, no devices such as transistors are formed in the dummy regions 80. When polishing by CMP an insulating film for the STI, the upper face of the dummy regions 80 is covered with an SiN layer, as are the upper faces of the device active regions 50 and 60. This SiN layer will be removed after finishing CMP.

Conventionally, the aforementioned selective-growth mask is patterned so as to completely cover the dummy regions 80, and therefore no SiGe-containing layer will epitaxially grow on the dummy regions 80.

[Patent Document 1] Japanese Laid-Open Patent Publication No. 11-16999

DISCLOSURE OF INVENTION

When a layer including an SiGe layer is selectively grown on the device active region 50, it is necessary to form an aperture in the selective-growth mask, so as to selectively expose a portion of the underlying Si surface of the Si substrate, as described above. The proportion accounted for by the area of this aperture of the selective-growth mask, against the overall area of the Si substrate principal face, will be referred to as an "aperture ratio". This aperture ratio is an important parameter which greatly affects the selective epitaxial growth. If the aperture ratio changes, even though the conditions of selective epitaxial growth (flow rate of the source gas and substrate temperature) may be the same, the epitaxial growth rate might change, so that the thickness of the SiGe-containing layer might vary or it might become impossible to ensure selectivity.

In particular, the size and number of active regions of the SiGe device will differ for different product types of semiconductor devices, possibly resulting in great variations in the aperture ratio of the selective-growth mask. Therefore, when fabricating semiconductor devices of different product types, simply performing SiGe epitaxial growth under the same conditions may result in the thickness and composition of the resultant SiGe layer deviating from their target values. Thus, it is necessary to review the optimum epitaxial growth condition for each product type. Accordingly, even when slight changes in circuit design arise, it becomes necessary to change the epitaxial growth condition. Moreover, even as to the same product type, there is a possibility that the aperture ratio may not be uniform across the substrate, and the aperture area may vary depending on the position on the chip. In such cases, the thickness of the resultant SiGe layer may fluctuate within the chip.

The present invention has been made in order to solve the aforementioned problems, and a main purpose thereof is to provide a semiconductor device which allows for uniform thickness of an epitaxial growth layer despite changes in the specifications and circuit design of the semiconductor device, as well as a production method and a designing method thereof.

A production method for a semiconductor device according to the present invention is a production method for a semiconductor device, comprising: step (A) of providing a substrate including a semiconductor layer having a principal face, the substrate having a device isolation structure formed in an isolation region for partitioning the principal face into a plurality of device active regions; step (B) of growing an epitaxial layer containing Si and Ge, or Si and C, on selected device active regions among the plurality of device active regions of the principal face of the semiconductor layer; and step (C) of forming a field-effect transistor in, among the plurality of device active regions, each of the device active regions on which the epitaxial layer is formed and each of the device active regions on which the epitaxial layer is not formed, wherein, step (A) comprises step (a1) of forming, in the isolation region, a plurality of dummy regions surrounded by the device isolation structure; and step (B) comprises step (b1) of growing a layer of the same material as that of the epitaxial layer on selected regions among the plurality of dummy regions.

In a preferred embodiment, step (A) comprises: step (a2) of forming a trench on the principal face of the semiconductor layer; step (a3) of filling the trench with an insulator; and step (a4) of polishing and planarizing an upper face of the insulator, and a portion of the principal face of the semiconductor layer where the insulator does not exist includes the plurality of device active regions and the plurality of dummy regions, the semiconductor composing the semiconductor layer being exposed at a surface of the plurality of device active regions and the plurality of dummy regions.

In a preferred embodiment, step (B) comprises: before step (b1), step (b2) of forming a selective-growth mask; and after step (b1), step (b3) of removing the selective-growth mask, and the selective-growth mask has apertures over the selected device active regions among the plurality of device active regions and over the selected regions among the plurality of dummy regions, and completely covers at least some of the plurality of device active regions.

In a preferred embodiment, after step (b2) and before growing the epitaxial layer, a step of etching back a portion of the surface of the plurality of device active regions and the plurality of dummy regions where the semiconductor composing the semiconductor layer is exposed, from the surface is comprised.

In a preferred embodiment, the epitaxial layer is grown until the surface of the epitaxial layer becomes level with a surface of a portion of the semiconductor layer that has not been etched back.

In a preferred embodiment, step (B) comprises: a step of growing an Si epitaxial layer not containing Ge on the epitaxial layer containing Si and Ge or Si and C.

In a preferred embodiment, the field-effect transistors are MOS transistors.

In a preferred embodiment, the substrate is a monocrystalline Si substrate or an SOI substrate.

In a preferred embodiment, a plurality of dummy regions are provided in the surroundings of a device active region which is not covered by the selective-growth mask, and at least one of those plurality of dummy regions is not covered by the selective-growth mask.

In a preferred embodiment, a plurality of dummy regions are provided in the surroundings of a device active region which is not covered by the selective-growth mask, and among those plurality of dummy regions, any dummy region that adjoins the device active region is not covered by the selective-growth mask.

In a preferred embodiment, when a device active region which is covered by the selective-growth mask adjoins a device active region which is not covered by the selective-growth mask, at least one dummy region is provided between the two device active regions, the dummy region being not covered by the selective-growth mask.

In a preferred embodiment, when an even number of device active regions in which field-effect transistors constituting a differential pair transistor circuit are formed exist as device active regions which are not covered by the selective-growth mask, those dummy regions which are in symmetric positions with respect to an axis of symmetry of the even number of device active regions are not covered by the selective-growth mask.

In a preferred embodiment, an L-shaped dummy region is provided near a corner portion of a device active region which is not covered by the selective-growth mask, the L-shaped dummy region being not covered by the selective-growth mask.

In a preferred embodiment, at least one C-shaped dummy region is provided in the surroundings of a device active region which is not covered by the selective-growth mask, the C-shaped dummy region being not covered by the selective-growth mask.

In a preferred embodiment, an H-shaped dummy region is provided in a position interposed between a plurality of device active regions which are not covered by the selective-growth mask, the H-shaped dummy region being not covered by the selective-growth mask.

A semiconductor device according to the present invention is a semiconductor device comprising: a substrate including a semiconductor layer having a principal face, the substrate having a device isolation structure formed in an isolation region for partitioning the principal face into a plurality of device active regions; an epitaxial layer containing Si and Ge, or Si and C, grown on selected device active regions among the plurality of device active regions of the principal face of the semiconductor layer; a field-effect transistor formed in, among the plurality of device active regions, the device active regions on which the epitaxial layer is formed; a field-effect transistor formed in the device active regions on which the epitaxial layer is not formed, a plurality of dummy regions formed in the isolation region and surrounded by the device isolation structure, wherein a layer of the same material as that of the epitaxial layer is provided on selected regions among the plurality of dummy regions.

In a preferred embodiment, the level of a surface of the device active regions in which the epitaxial layer is formed is lower than the level of a surface of the device active regions in which the epitaxial layer is not formed.

In a preferred embodiment, the level of a surface of the epitaxial layer is equal to the level of a surface of the device active regions in which the epitaxial layer is not grown.

In a preferred embodiment, in a plurality of dummy regions provided in the surroundings of a device active region in which the epitaxial layer is grown, a layer of the same material as that of the epitaxial layer is formed.

In a preferred embodiment, in each of a plurality of dummy regions adjoining a device active region in which the epitaxial layer is grown, a layer of the same material as that of the epitaxial layer is formed.

In a preferred embodiment, a device active region in which the epitaxial layer is not formed adjoins a device active region in which the epitaxial layer is formed, and at least one dummy region is provided between the two device active regions, a layer of the same material as that of the epitaxial layer being formed on the dummy region.

In a preferred embodiment, an even number of device active regions in which field-effect transistors constituting a differential pair transistor circuit are formed exist as device active regions in which the epitaxial layer is formed, and a layer of the same material as that of the epitaxial layer is formed in those dummy regions which are in symmetric positions with respect to an axis of symmetry of the even number of device active regions.

In a preferred embodiment, an L-shaped dummy region is provided near a corner portion of a device active region in which the epitaxial layer is formed, and a layer of the same material as that of the epitaxial layer is formed on the L-shaped dummy region.

In a preferred embodiment, at least one C-shaped dummy region is provided in the surroundings of a device active region in which the epitaxial layer is formed, and a layer of the same material as that of the epitaxial layer is formed on the C-shaped dummy region.

In a preferred embodiment, an H-shaped dummy region is provided in a position interposed between a plurality of device active regions in which the epitaxial layer is formed, and a layer of the same material as that of the epitaxial layer is formed on the H-shaped dummy region.

The present invention comprises a step of growing, on selected regions among a plurality of dummy regions, a layer which is composed of the same material as that of an epitaxial layer which is grown on a device region. This allows for uniform selective growth of the epitaxial layer even when the arrangement and areas of device active regions change.

BRIEF DESCRIPTION OF DRAWINGS

[FIG. 1] Diagrams concerning the present invention for describing a method of growing an SiGe layer on a selected region, where 1(a) is a plan view showing a portion of a principal face of an Si substrate; and 1(b) is a cross-sectional view taken at line B-B in FIG. 6(a).

[FIG. 6] Diagrams concerning a conventional technique for describing a method of growing an SiGe layer on a selected region, where 6(a) is a plan view showing a portion of a principal face of an Si substrate; and 6(b) is a cross-sectional view taken at line B-B in FIG. 6(a).

[FIG. 7] Diagrams concerning another conventional technique for describing a method of growing an SiGe layer on a selected region, where 7(a) is a plan view showing a portion of a principal face of an Si substrate; and 7(b) is a cross-sectional view taken at line B-B in FIG. 6(a).

[FIG. 9] 9(a) is a plan view for describing a problem concerning the device active region 50; and 9(b) is a plan view showing an device active region 50 and its neighborhood in Embodiment 4.

[FIG. 10] 10(a) is a plan view for describing a problem which may arise in the case where the device active region 50 and the device active region 60 adjoin each other; and 10(b) is a plan view showing device active regions 50 and 60 and their neighborhood in Embodiment 5.

[FIG. 12] 12(a) and 12(b) are each a diagram showing an exemplary circuit having the differential pair transistors of Embodiment 6.

[FIG. 13] 13(a) and 13(b) are each a main-portion plan view, showing an exemplary arrangement of L-shaped dummy regions in Embodiment 7.

[FIG. 14] 14(a) and 14(b) are each a main-portion plan view, showing an exemplary arrangement of C-shaped dummy regions in Embodiment 8

DESCRIPTION OF THE REFERENCE NUMERALS

Figure 2:
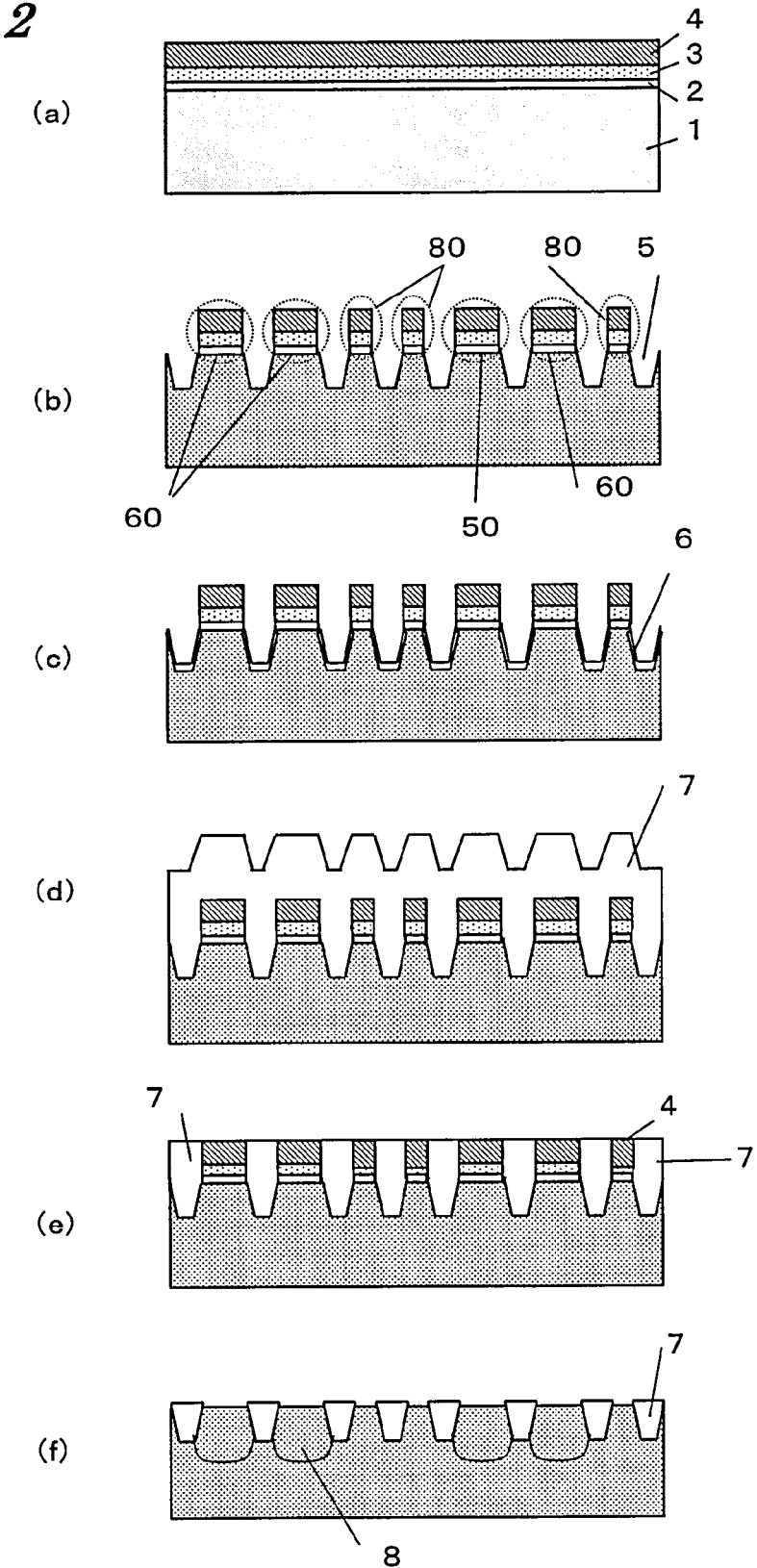
[FIG. 2] 2(a) to 2(f) are step cross-sectional views illustrating an embodiment of a production method of a semiconductor device according to the present invention.

1 Si substrate
2 protective oxide layer (SiO$_2$ film)
3 polysilicon layer
4 SiN layer
5 device isolation trench
6 protective oxide layer
7 Si oxide film
8 well
9 selective-growth mask material layer
10 selective-growth mask
11 Si buffer layer
12 SiGe channel layer
13 Si capping layer
14 gate insulating film 15 gate electrode
16 LDD
17 side wall
18 source/drain
19 silicide layer
20 interlayer insulating film
21 plug
22 aluminum wiring
30 insulator
50 device active region
60 device active region
70 isolation region
80 dummy region
80a L-shaped dummy region
80b C-shaped dummy region
80c H-shaped dummy region
90 SiGe-containing layer (epitaxial layer)

BEST MODE FOR CARRYING OUT THE INVENTION

In the present invention, by utilizing dummy regions which are formed for suppression of dishing during CMP, the aperture ratio of a selective-growth mask for SiGe can be maintained within a predetermined range, even when the arrangement and total area of device active regions change due to changes in product type, specifications, design, and the like.

First, with reference to FIGS. 1(a) and (b), features of the selective growth of an SiGe-containing layer according to the present invention will be described. FIG. 1(a) is a plan view showing a portion of a principal face of an Si substrate 1, where device active regions 50 and 60, an isolation region 70, and dummy regions 80 are shown. FIG. 1(b) is a cross-sectional view taken at line B-B in FIG. 1(a).

The dummy regions 80 in the isolation region 70 are provided in order to prevent dishing when planarizing an embedding insulating film of STI by CMP technique, and their shape, size, and arrangement are optimized so as to enable uniform planarization by CMP technique. In the present invention, an SiGe-containing layer is grown not only on the device active region 50, but also on dummy regions 80 which are provided for CMP. However, rather being grown on all of the dummy regions 80, the SiGe-containing layer 90 is grown on those dummy regions 80 which are located in a specific area. Such growth can be realized by performing a selective growth while leaving the specific dummy regions 80 exposed without being covered by the selective-growth mask, this being attained through appropriate designing of the size, shape, position, and the like of the apertures of the selective-growth mask. The designing method for the size, shape, position, and the like of the aperture of the selective-growth mask will be specifically described later.

Hereinafter, preferred embodiments of the present invention will be described.

EMBODIMENT 1

Figure 3:
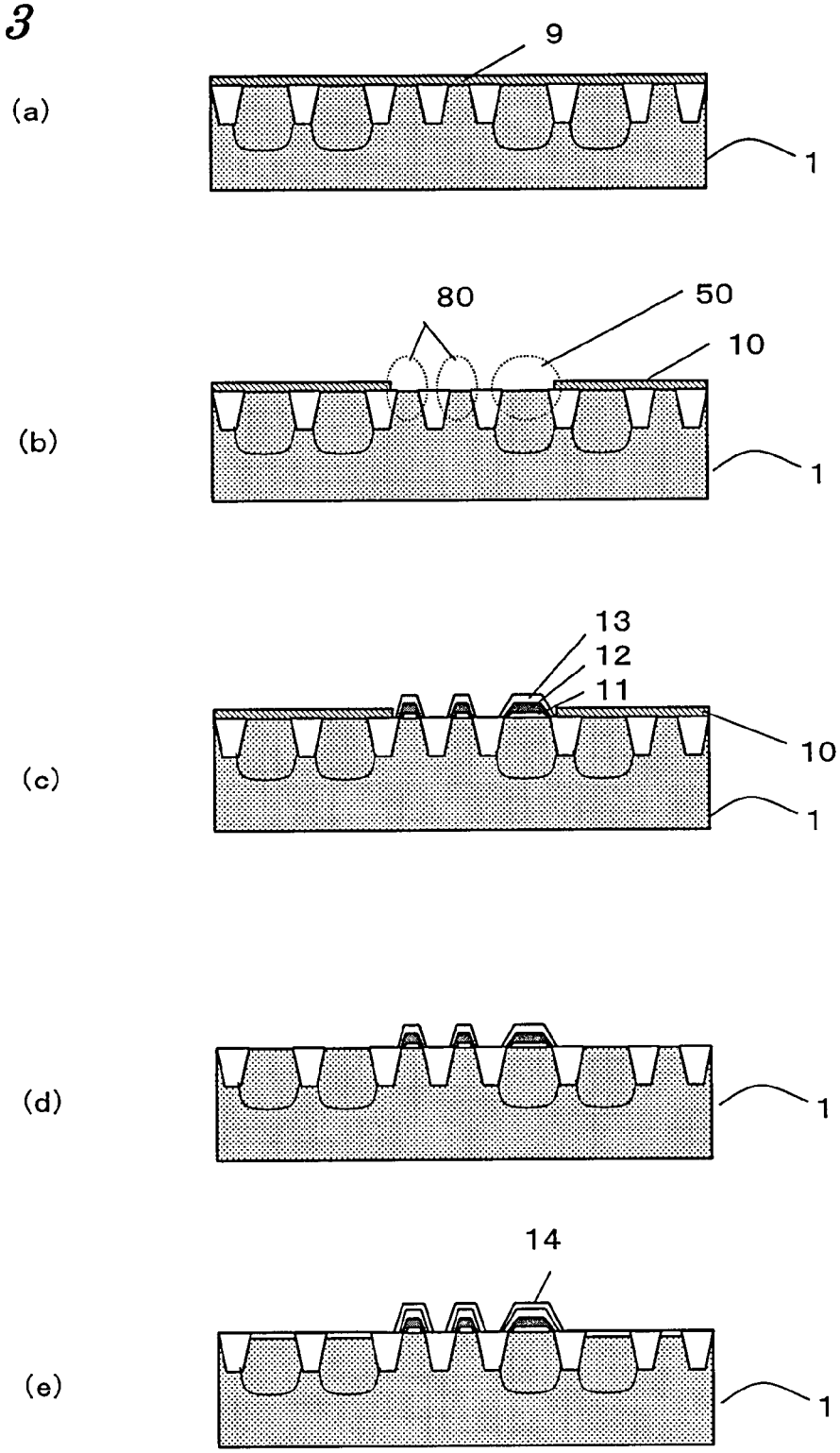
[FIG. 3] 3(a) to 3(e) are step cross-sectional views illustrating an embodiment of a production method of a semiconductor device according to the present invention.
Figure 4:
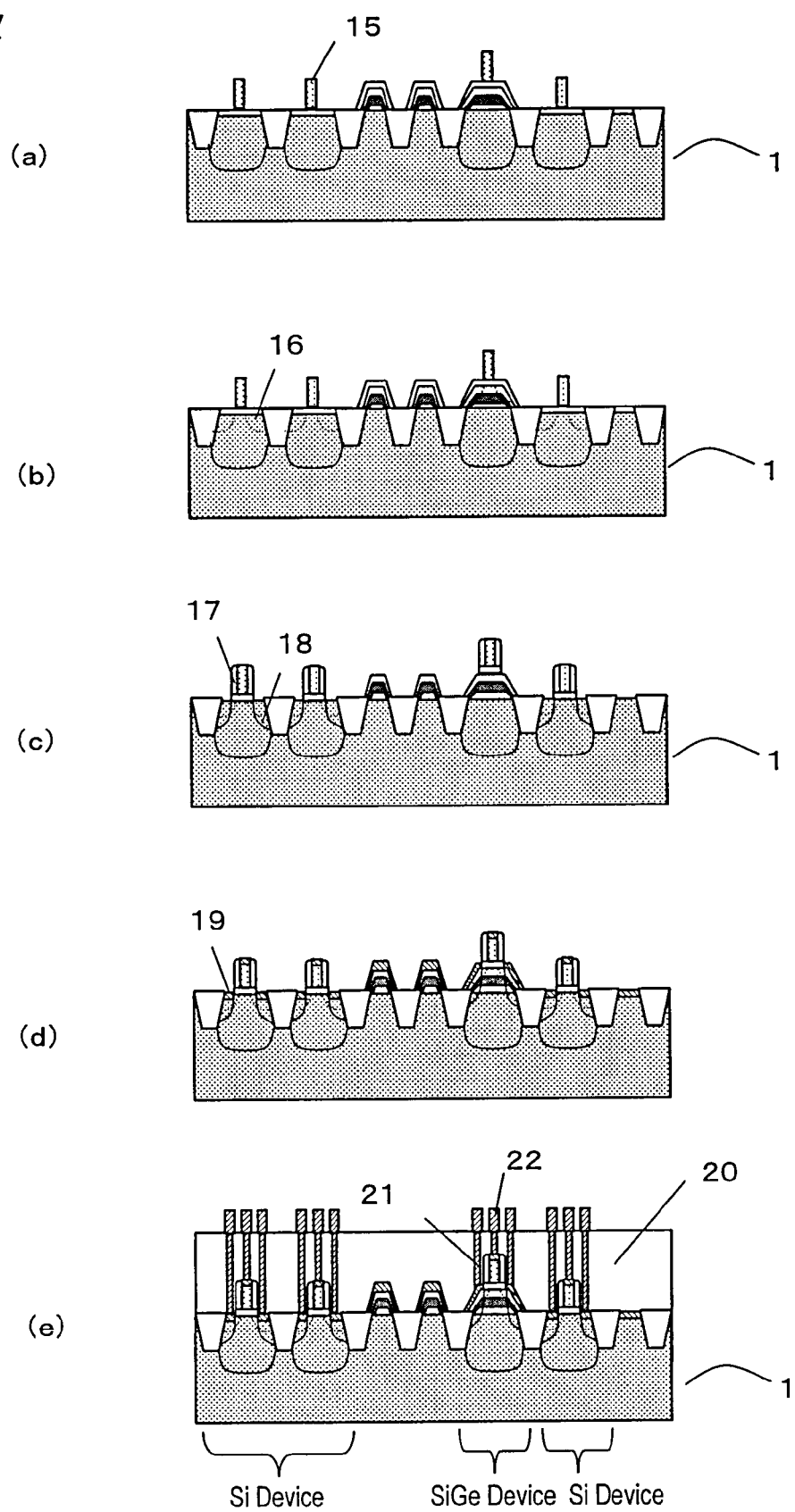
[FIG. 4] 4(a) to 4(e) are step cross-sectional views illustrating an embodiment of a production method of a semiconductor device according to the present invention.

With reference to FIG. 2 to FIG. 4, a first embodiment of the present invention will be described.

First, as shown in FIG. 2(a), the surface of an Si substrate 1 is subjected to thermal oxidation at about 1000 to 1100° C., thus forming a protective oxide layer ($SiO_2$ layer) 2 having a thickness of about 20 to 30 nm. The Si substrate 1 is typically a monocrystalline Si wafer, but may alternatively be an SOI substrate. Next, by CVD technique, a polysilicon layer 3 having a thickness of about 50 nm is deposited on the protective oxide layer 2, and thereafter an SiN layer 4 having a thickness of about 150 nm is deposited on the polysilicon layer 3 by CVD technique. The deposit temperature for the SiN layer 4 is about 700 to 800° C. Thereafter, by lithography technique, a resist mask which defines the pattern of the device active regions and dummy regions 80 is formed on the SiN layer 4.

Portions of the above multilayer structure which are not covered by the resist mask are etched, thus patterning the SiN layer 4, the polysilicon layer 3, and the protective oxide layer 2. This etching is preferably performed by a dry etching technique which provides a high anisotropy. As a gas for dry etching, $CF_4$ or $CHF_3$ can be used for the etching of the SiN layer 4 and the protective oxide layer 2. Moreover, a gas such as $Cl_2$ or HBr can be used for the etching of the polysilicon layer 3. Through this dry etching, a principal face of the Si substrate 1 is partially exposed. Thereafter, the expose portions of the Si substrate 1 are etched, thus forming device isolation trenches 5 as shown in FIG. 2(b) on the surface of Si substrate 1. The Si etching can be performed through a dry etching using a gas such as $Cl_2$ or HBr. The depth of the device isolation trenches 5 is set in a range from 250 to 350 nm, for example.

Next, the Si surface which is exposed inside the device isolation trenches 5 is subjected to thermal oxidation at about 1000 to 1100° C., thus forming a protective oxide layer 6 having a thickness of about 20 to 30 nm as shown in FIG. 2(c). Thereafter, by HDP (high density plasma) technique, the interior of the device isolation trenches 5 is filled with an Si oxide film 7 as shown in FIG. 2(d). The thickness of the Si oxide film 7 to be deposited is set to a value which is sufficiently larger than the depth of the device isolation trenches 5, e.g., a value in the range from 500 to 800 nm.

Next, a surface polishing by CMP technique is performed. This polishing is performed until the SiN layer 4 is exposed as shown in FIG. 2(e). When this polishing is finished, the upper face of the insulator formed on the Si substrate 1 has been planarized, and its flat upper face has been partitioned into regions which are formed of the polished surface of the Si oxide film 7 and regions which are formed of the SiN layer 4. The regions which are formed of the polished surface of the Si oxide film 7 are located on the device isolation trenches 5, whereas the regions which are formed of the SiN layer 4 are located on the device active regions 50 and 60 and on the dummy regions 80.

Next, after removing the SiN layer 4 by using hot concentrated phosphoric acid, the polysilicon layer 3 is removed by using hydrofluoric/nitric acid. Thereafter, the protective oxide layer 2 is removed by using hydrofluoric acid. Through this etching, the protective oxide layer 2 on the device active regions 50 and 60 and the dummy regions 80 is etched, and the upper portions of the Si oxide film 7 that fill the device isolation trenches 5 are also partially etched. Through this etching, as shown in FIG. 2(f), the upper faces (Si faces) of the device active regions 50 and 60 and the dummy regions 80 of the principal face of the Si substrate 1 are exposed.

Next, through ion implantation, wells 8 are formed in the device active regions. Among the wells 8, ions of As (arsenic) and P (phosphorus) are implanted in the n type wells, whereas ions of B (boron) are implanted in the p type wells.

Thereafter, as shown in FIG. 3(a), a selective-growth mask material layer 9 having a thickness of about 10 to 30 nm is deposited. The selective-growth mask material layer 9 is formed of an SiN or $SiO_2$ film, or a multilayer film of these, for example. Next, as shown in FIG. 3(b), this selective-growth mask material layer 9 is patterned into a selective-growth mask 10. This patterning is performed by lithography and etching techniques, where the etching is preferably performed through wet etching using a chemical solution. As a chemical solution, hot concentrated phosphoric acid can be used in the case where the selective-growth mask material layer 9 is formed of SiN, whereas hydrofluoric acid can be used in the case where the selective-growth mask material layer 9 is formed of $SiO_2$. Note that, prior to forming the selective-growth mask material layer 9, a thermal oxide film having a thickness of about 5 nm may be formed on the exposed Si surface.

As shown in FIG. 3(b), each aperture in the selective-growth mask 10 define a region in which an SiGe-containing layer is to be epitaxially grown. In other words, the aperture in the selective-growth mask 10 is formed so as to include not only the device active region 50 but also the selected specific dummy regions 80, such that the device active region 60 composing the Si device and some of the dummy regions 80 are covered by the selective-growth mask 10. The epitaxial growth of any SiGe-containing layer will not occur on the selective-growth mask 10, but only selectively occur at the surface of the device active region 50 and the dummy regions 80 which are located within the aperture of the selective-growth mask 10.

Note that the crystals to be grown on the dummy regions 80 will not be finally used as active regions of any transistors. The reason for growing crystals on the dummy regions 80 is to ensure that the area of the regions in which selective growth of crystals is to be performed (or specifically, the aperture ratio of the selective-growth mask 10) stays substantially constant from chip to chip. Therefore, the question as to which portions among the dummy regions 80 are to be covered by the selective-growth mask 10 and which portions are to be exposed should be optimized from the perspective of performing uniform selective epitaxial growth. The method for this optimization will be described later.

Next, as shown in FIG. 3(c), by using UHV-VCD technique, an Si buffer layer 11 having a thickness of about 2 to 5 nm, an SiGe channel layer 12 having a thickness of about 5 to 15 nm, and an Si capping layer 13 having a thickness of about 2 to 5 nm are sequentially grown, so as to be present only within the aperture in the selective-growth mask 10. The growth temperature is set to about 500 to 600° C., and $GeH_4$ and $Si_2H_6$ are used as source gases. HCl gas may be added for enhanced selectivity during crystal growth. Thus, a multilayer structure composed of Si layers and an SiGe layer is formed as an SiGe-containing layer in the present embodiment. By adjusting the composition ratio of the Ge in the SiGe layer, any desired strain can be created. Note that carbon may be added to the SiGe layer.

In the case where MOS transistors having high-mobility are to be fabricated as in the case of the present embodiment, it is preferable to set the Ge composition of SiGe to about 15 to 50%. If the Ge composition is lower than this range, the effect of hole mobility enhancement will be small, and if the Ge composition is greater than this range, lattice relaxation will become likely to occur, neither of which is preferable. Next, as shown in FIG. 3(d), the selective-growth mask 10 is peeled through wet etching. As a chemical solution for the wet etching, a chemical solution of the same type as the chemical solution that is used for the patterning of the selective-growth mask 10 can be used. After a surface cleaning, as shown in FIG. 3(e), a gate insulating film 14 is formed. The gate insulating film 14 can be formed by subjecting the surface of the epitaxial layer to a thermal oxidation in a temperature range from 750 to 1050° C., or depositing an insulating film by other methods. It is preferable to perform the formation of the gate insulating film 14 at a relatively low temperature because this will make it possible to suppress the lattice relaxation due to a lattice mismatch between Si and SiGe. Therefore, it is preferable to form the gate insulating film 14 in a range from 750 to 900° C. As the gate insulating film 14, an $SiO_2$ film, an SiON film, or a multilayer structure of them is used. A high-dielectric material such as $ZrO_2$ or $HfO_2$ may also be used.

Next, after depositing a polysilicon layer to about 150 to 250 nm by using CVD technique, gate electrodes 15 are formed through lithography and dry etching, as shown in FIG. 4(a). The patterning of the polysilicon can be performed through a dry etching which employs an etching gas, e.g., chlorine or hydrogen bromide.

Next, an impurity ion implantation with a relatively low dose is performed by using the gate electrodes 15 as implantation masks, thus forming LDDs (Lightly doped drains) 16 as shown in FIG. 4(b). Next, as shown in FIG. 4(c), after forming side walls 17 on side faces of each gate electrode 15, source/drains 18 are formed in the semiconductor in each active region. The side walls 17 are produced by, after an $SiO_2$ film or an SiN layer or a multilayer film of them is deposited, etching the entire surface through a dry etching which provides a high anisotropy. Next, in order to lower the resistance of the gate electrodes 15 and the sources/drains 18, which are composed of polysilicon, the surface of each gate electrode 15 and the surface of each source/drain 18 is made into a silicide, thus forming a silicide layer 19 as shown in FIG. 4(d). The silicide layer 19 is preferably Co silicide, Ti silicide, Ni silicide, or the like.

Thereafter, as shown in FIG. 4(e), an interlayer insulating film 20 is deposited by CVD technique. As the material of the interlayer insulating film 20, $SiO_2$ can be used. In order to lower the dielectric constant of the interlayer insulating film 20, fluorine may be added in the $SiO_2$. Thereafter, contact holes are formed in the interlayer insulating film 20 by dry etching, and the contact holes thus formed are filled with a metal, whereby plugs 21 are formed. In the case where W (tungsten) is used as the material of the plugs 21, it is easy to fill inside the contact holes by CVD technique. Furthermore, after an aluminum layer having a thickness of about 500 to 700 nm is deposited on the interlayer insulating film 20 by sputtering technique, this aluminum layer is patterned, whereby wirings 22 of aluminum are formed.

Through the above method, a semiconductor device in which SiGe devices and Si devices coexist on the same substrate can be fabricated with a good production yield. In the present embodiment, since an SiGe-containing layer is grown also on the dummy regions 80, which are formed for preventing dishing during CMP, the apertures in the selective-growth mask can be adjusted and maintained within a predetermined range even when the total area or arrangement of active region for the SiGe devices change.

Note that the steps illustrated in FIG. 2 to FIG. 4 merely constitute a preferable embodiment of the present invention, and that the present invention can be practiced through various other production steps.

EMBODIMENT 2

Figure 5:
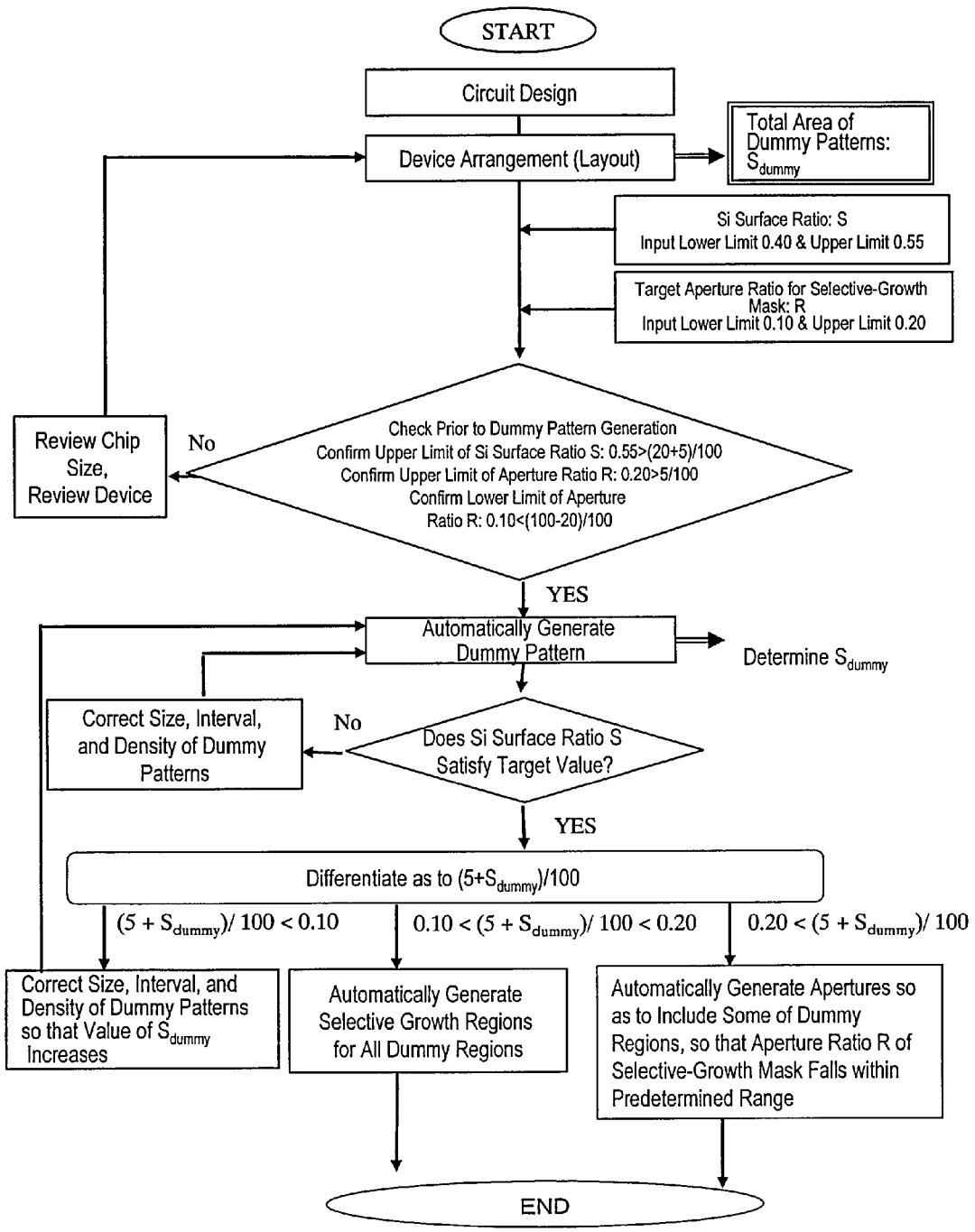
[FIG. 5] A flowchart showing an exemplary procedure for determining the aperture ratio of a selective-growth mask according to the present invention.

Next, with reference to FIG. 5, an embodiment of a circuit designing method for a semiconductor device according to the present invention will be described.

In the present embodiment, assuming that the chip area (overall area) is 100, a total area of the SiGe device regions (corresponding to the device active region 50 in FIG. 1) is set to 5, and a total area of the Si device regions (corresponding to the device active region 60 in FIG. 1) is set to 20. A total area of the dummy regions which are provided for suppressing the dishing during CMP is represented as $S_{dummy}$.

First, circuit designing is carried out to set a device arrangement (layout) and set a pattern of dummy regions. In order to facilitate automatic designing of arrangement of the dummy regions (dummy pattern), it is preferable that each individual dummy region be a unit structure of substantially the same shape and area, so that a dummy pattern is defined through simple arraying of the unit structures. By determining the arraying of all devices such as MOS transistors (field-effect transistors), the device isolation region will be fixed, and therefore the size of the total area $S_{dummy}$ of dummy regions will also be fixed.

In the present embodiment, in order to uniformize the CMP polishing amount within an appropriate range, a target area ratio (hereinafter referred to as the "Si surface ratio S") of the regions (i.e., the device active regions and dummy regions) which are to be covered with pads for CMP such as SiN is set in a range of no less than 0.40 and no more than 0.55. Also, in order to ensure stable selective growth, a target aperture ratio R of the selective-growth mask is set in a range of no less than 0.10 and no more than 0.20. The upper and lower limit values of these ranges are only exemplary, and may also be set to any other values.

In the case of the present embodiment, if no dummy regions were to be formed at all, the Si surface ratio S would be 25(=5+20)/100=0.25, which is lower than not only the upper limit value (0.55) but also the lower limit value (0.40) of the aforementioned range for S. Therefore, it is necessary to add dummy regions in order to place the Si surface ratio S within the range of no less than 0.40 and no more than 0.55. Note that, if the Si surface ratio S already exceeds 0.55 prior to the additional formation of dummy regions, it is necessary to review the configuration and chip size of the device and re-set the device arrangement (layout).

The ratio in the chip area that is accounted for by the total area of the SiGe device regions must be equal to or less than the upper limit value (0.20) of the aperture ratio R of the selective-growth mask, and the ratio in the chip area that is accounted for by the total area other than the Si device regions must be equal to or greater than the lower limit value (0.10) of the aperture ratio R of the selective-growth mask. The reason is that, if the ratio of the total area of the SiGe device regions is above the upper limit value (0.20) of the aperture ratio R of the selective-growth mask, it will be impossible to perform epitaxial growth under appropriate conditions even in the case where selective growth of crystals is performed only on the SiGe device regions. Moreover, if the ratio of the total area other than the Si device regions is below the lower limit value (0.10) of the aperture ratio R of the selective-growth mask, it will be necessary to grow an SiGe-containing layer also on the Si device regions in order to further increase the aperture ratio R of the selective-growth mask. Therefore, if the ratio of the total area of the SiGe device regions is equal to or less than the upper limit value (0.20) of the aperture ratio R of the selective-growth mask, or if the ratio of the total area other than the Si device regions is equal to or greater than the lower limit value (0.10) of the aperture ratio R of the selective-growth mask, it is necessary to review the configuration and chip size of the device, and re-set the device arrangement (layout). A check prior to dummy pattern generation in FIG. 5 corresponds to this step of confirmation. Since these conditions are satisfied (YES) under the settings in the present embodiment, control will proceed to the step of automatically generating a dummy pattern.

Through an automatic generation of a dummy pattern, the number and arrangement of dummy regions is determined, and thus the size of the total area $S_{dummy}$ of the dummy regions will be determined. A value obtained by adding the total area $S_{dummy}$ of the dummy regions to the total area of the Si device regions and the SiGe device regions (i.e., 25% of the chip area in the present embodiment) corresponds to the area of the regions in which no device isolation trenches are to be formed. In other words, the Si surface ratio S is calculated as $(5+20+S_{dummy})/100$. It is checked whether this Si surface ratio S falls within the range of no less than 0.40% and no more than 0.55, and if it falls outside this range, correction of the size, interval, and density of the dummy patterns is performed.

If the Si surface ratio S falls within the predetermined range, control proceeds to a step of differentiating the value represented by $(5+S_{dummy})/100$, where $(5+S_{dummy})/100$ means a maximum area ratio of the regions in which selective growth of an SiGe-containing layer can be performed. In other words, selective growth cannot be performed under appropriate conditions if $(5+S_{dummy})/100$ is less than 0.10; therefore, in the case where $(5+S_{dummy})/100$ is less than 0.10, the size, interval, and density of the dummy pattern are corrected so that the value of $S_{dummy}$ will increase.

On the other hand, if $(5+S_{dummy})/100$ falls within the range of no less than 0.10 and no more than 0.20, the apertures in the selective-growth mask are set so as to allow an SiGe-containing layer to be grown on all of the dummy regions. Conversely, if $(5+S_{dummy})/100$ exceeds 0.20, performing selective growth on all of the dummy regions would result in the selective growth regions being too broad. Therefore, in the case where $(5+S_{dummy})/100$ exceeds 0.20, the layout of the selective-growth mask is determined so that $(5+SR_{dummy})/100$ is no less than 0.10% and no more than 0.20%, where $SR_{dummy}$ is the total area of the dummy regions that are contained within the apertures of the selective-growth mask.

Although the ratio of the total area of the SiGe device regions relative to the chip area is set to 5% and the ratio of the total area of the Si device regions relative to the chip area is set to 20% in the present embodiment, the present invention is not limited to such a case, but is rather applicable to a variety of cases.

Moreover, it is not a requirement that the edge of each aperture in the selective-growth mask be formed so as not to lie across any dummy region 80. Rather, a portion of one dummy region may be covered by the selective-growth mask, whereas its remaining portion may be contained within an aperture.

EMBODIMENT 3

Hereinafter, another embodiment of the semiconductor device according to the present invention and a production method thereof will be described.

In the above-described embodiments, the channel regions of the Si devices are formed on the surface of the Si substrate, whereas the channel regions of the SiGe devices are formed not on the surface of the Si substrate 1, but on the epitaxial layer which is grown on the surface thereof. As a result, in the above embodiments, a level difference corresponding to the thickness of the epitaxial layer exists between the SiGe devices and the Si devices. Especially according to the present invention, an epitaxial layer is grown not only on the device active regions 50 in which SiGe devices are formed but also on the dummy regions 80, and therefore a multitude of protrusions and recesses will be formed on the surface of the Si substrate 1, as shown in FIG. 5(c). Such protrusions and recesses, if left as they are, may invite defects (short-circuiting or breaking) in the upper layer wirings. Moreover, pattern mistakes may occur at the protrusions and recesses during the photolithography step for forming the gate electrodes.

In the present embodiment, the surface level of the regions in which epitaxial growth is performed is lowered in advance, thus reducing the level difference occurring between the upper face of each epitaxial layer and the upper face of the Si substrate. Preferably, this level difference is eliminated so as to attain planarization.

Figure 8:
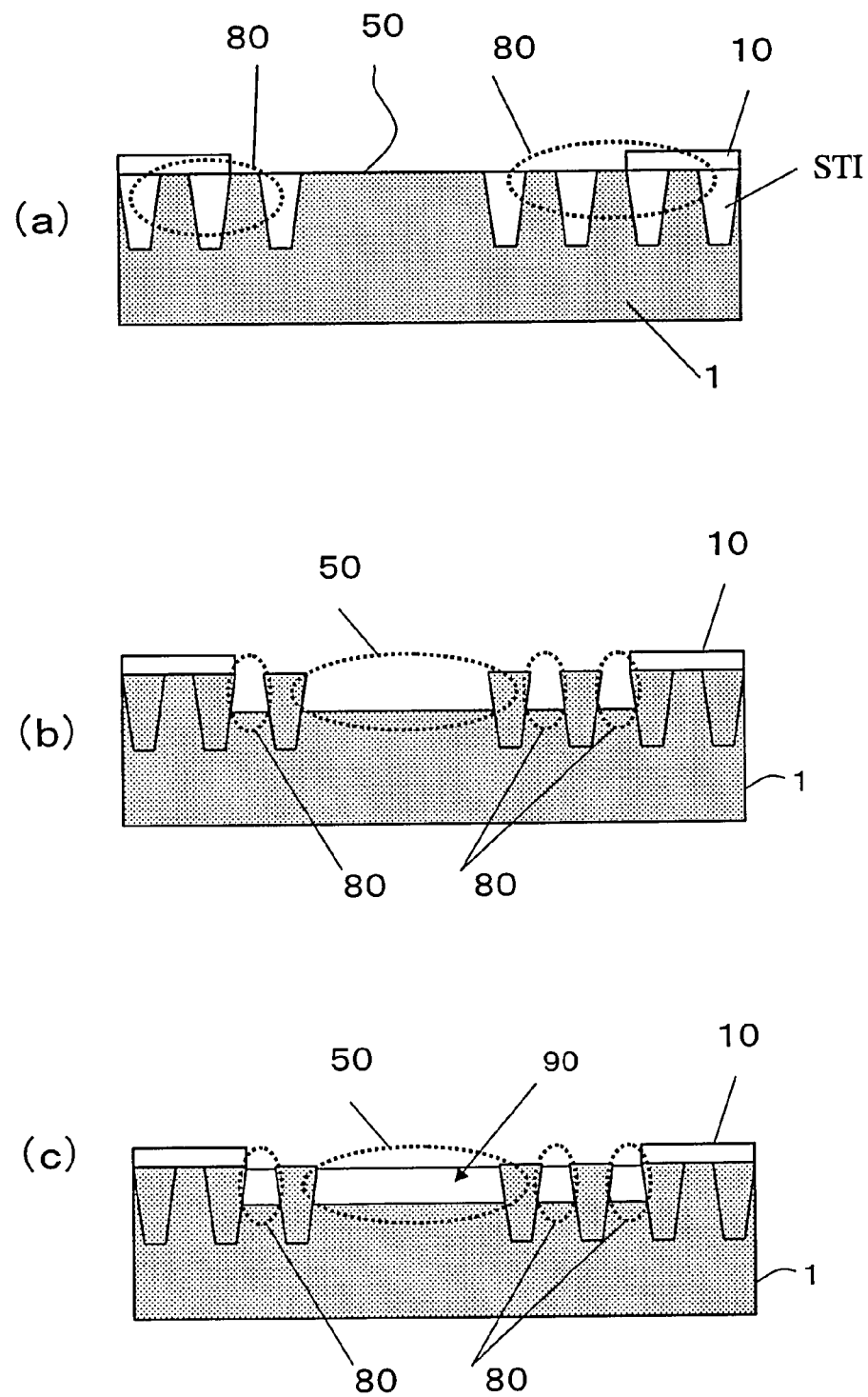
[FIG. 8] 8(a) to 8(c) are step cross-sectional views showing a production method according to Embodiment 3.

First, FIG. 8(a) is referred to. FIG. 8(a) is a cross-sectional view, which substantially corresponding to FIG. 5(b), showing a cross section when the selective-growth mask 10 has just been formed.

Next, those portions of the surface of the Si substrate 1 which are not covered by the selective-growth mask 10 are selectively etched. Specifically, the Si substrate 1 is maintained at a temperature from 750° C. to 1050° C. in an atmosphere of HCl gas or $Cl_2$ gas. The Si surface which has been exposed to such an ambient gas will be etched with a higher priority, whereas $SiO_2$ will be hardly etched. As a result of this etching, as shown in FIG. 8(b), recesses are formed in each device active region 50 and its surrounding dummy regions 80. The selective etching of Si may be performed through reactive ion etching (RIE) using $Cl_2$ or Hbr gas.

Preferably, the depth of the recesses to be formed by etching Si is set equal to the thickness of the epitaxial layer 90 which is grown thereafter. However, since some effect of reducing the level difference is obtained through selective etching of Si, it is not necessary that the etching depth be exactly equal to the thickness of the epitaxial layer. In the present embodiment, Si etching is to be performed from the surface to a depth of about 20 nm.

As shown in FIG. 8(c), by using UHV-CVD technique, an Si buffer layer having a thickness of about 2 to 5 nm, an SiGe channel layer having a thickness of about 5 to 15 nm, and an Si capping layer having a thickness of about 2 to 5 nm are sequentially grown, so as to be present only within the aperture of the selective-growth mask 10. The growth temperature is set to about 500 to 600° C., and $GeH_4$ and $Si_2H_6$ are used as source gases. HCl gas may be added for enhanced selectivity during crystal growth. By adjusting the composition ratio of the Ge in the SiGe layer, any desired strain can be created. Note that carbon may be added to the SiGe layer.

In the present embodiment, as shown in FIG. 8(c), the upper face of the epitaxial layer 90 and the upper face of the Si substrate 1 are substantially level, so that level differences between devices are reduced.

EMBODIMENT 4

Another embodiment of the semiconductor device according to the present invention will be described.

First, with reference to FIG. 9(a), a problem which may occur in the case where an epitaxial layer (SiGe-containing layer) 90 is grown on an islanded device active region 50 will be described. Herein, a case will be considered where a device active region 50 shown in FIG. 9(a) alone is exposed through an aperture in a selective-growth mask (not shown), whereas any dummy regions in its surroundings are completely covered by the selective-growth mask.

In such a case, selective growth of the epitaxial layer 90 occurs only on the device active region 50, which is not covered by the selective-growth mask. Since this device active region 50 is away and separated from the other device active regions (not shown), the source gas which is necessary for the epitaxial growth is not consumed in the surroundings of the device active region 50, so that excess source gas will be supplied to the device active region 50. As a result, as compared to the case where a plurality of device active regions 50 are placed near one another, the resultant epitaxial layer 90 tends to become relatively thick. Stated otherwise, variations in the thickness of the resultant epitaxial layer 90 occur depending on whether the device active region 50 in which epitaxial growth is performed is an isolated pattern or not.

In the present embodiment, as shown in FIG. 9(b), in the case where there is a large distance between a plurality of device active regions 50 where epitaxial growth is to be performed, epitaxial growth is also performed in the dummy regions 80 surrounding each such device active region 50, in order to reduce the aforementioned variation in thickness.

According to the present embodiment, the thickness of the epitaxial layer 90 grown on the device active region 50 is prevented from increasing beyond a design value because source gas is moderately consumed in the dummy regions 80 surrounding the device active region 50.

In the present embodiment, in order to allow an epitaxial layer to be grown on all of the dummy regions 80 adjoining the device active region 50, the shape of the selective-growth mask is designed so that the device active region 50 and all of the adjoining dummy regions 80 are located within an aperture of the selective-growth mask. However, moderate consumption of source gas can also be realized by growing an epitaxial layer on only some of the dummy regions 80 adjoining the device active region 50.

In FIG. 9(b), among the plurality of dummy regions 80, an epitaxial layer is grown on only those dummy regions 80 which adjoin the device active region 50. However, an epitaxial layer may also be grown in the dummy regions 80 which are located further outside.

EMBODIMENT 5

Still another embodiment of the semiconductor device according to the present invention will be described.

First, with reference to FIG. 10(a), a problem which may occur in the case where a device active region 60 in which an Si device is formed and a device active region 50 in which an SiGe device is formed adjoin each other will be described.

FIG. 10(a) shows an exemplary arrangement in which no dummy regions 80 exist between the device active region 60 in which an Si device is formed and the device active region 50 in which an SiGe device is formed. MOS-type transistors having gate electrodes 15 are to be formed in these device active regions 50 and 60.

In this example, an epitaxial layer is grown on some dummy regions 80 adjoining the device active region 50 in which an SiGe device is formed, but the device active region 60 in which an Si device is formed is covered by a selective-growth mask (not shown) so that an epitaxial layer will not grow thereon.

In such an exemplary arrangement, at the sides adjoined by the dummy regions 80, the source gas which flows from the surroundings of the device active region 50 into the device active region 50 will be consumed by the dummy regions 80. However, it will not be consumed in the device active region 60, and therefore may flow into the device active region 50 in excess. Therefore, in the exemplary arrangement of FIG. 10(a), portions of the epitaxial layer 90 grown on the device active region 50 that are close to the device active region 60 tend to become thicker than the design value.

In order to solve the above problem, in the present embodiment, as shown in FIG. 10(b), dummy regions 80 are provided between the device active region 50 and the device active region 60, and an epitaxial layer 90 is grown also on these dummy regions 80. By doing so, source gas can be moderately consumed in the dummy regions 80 surrounding the device active region 50, whereby the thickness of the epitaxial layer 90 grown on the device active region 50 can be uniformized.

The dummy regions 80 to be placed between the device active region 50 and the device active region 60 need not to be in one row, but may be in two rows. Moreover, it is not necessary that an epitaxial layer 90 be grown on all of the plurality of dummy regions 80 that are placed between the device active region 50 and the device active region 60.

EMBODIMENT 6

Still another embodiment of the semiconductor device according to the present invention will be described.

Figure 11:
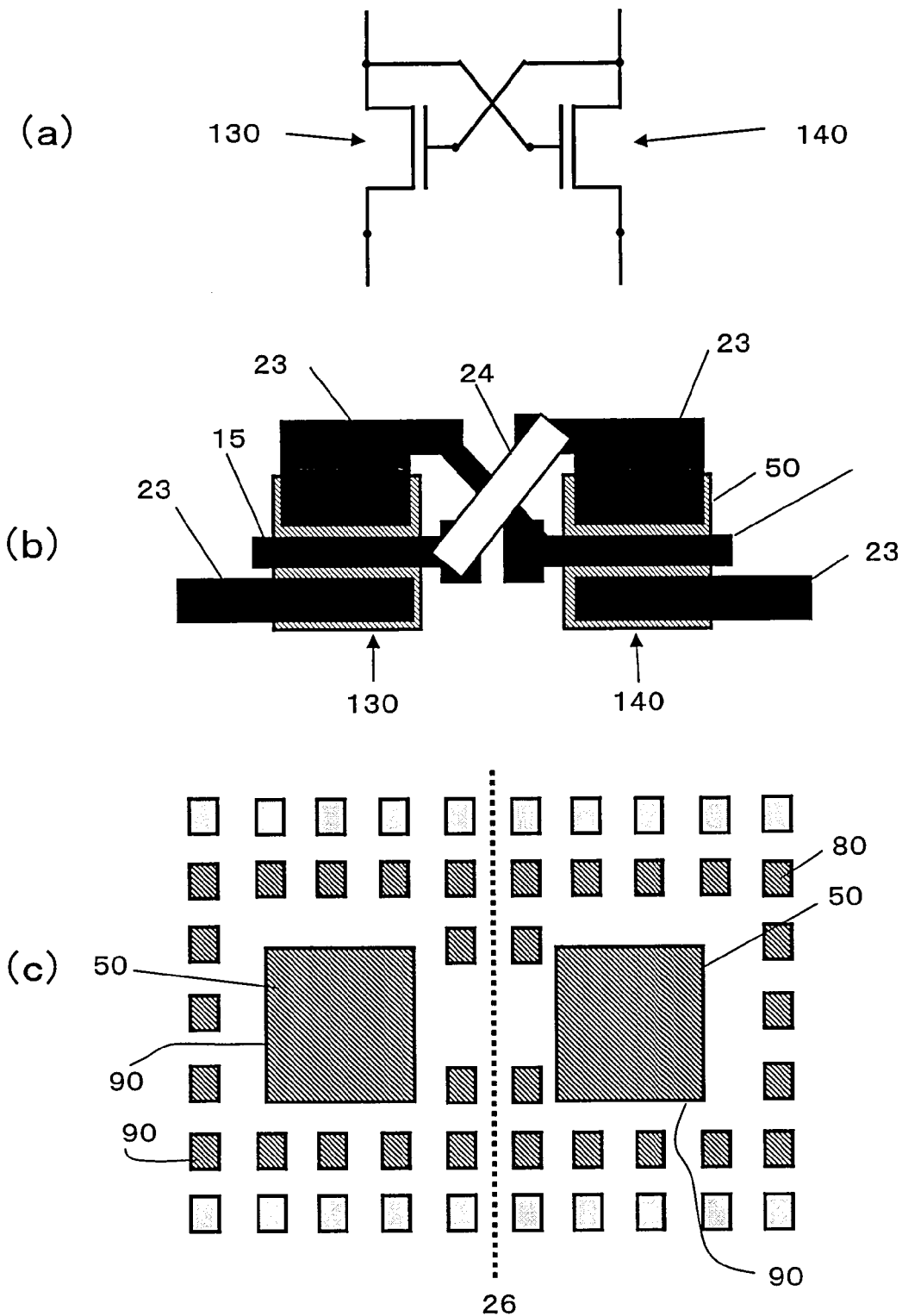
[FIG. 11] 11(a) is a circuit diagram showing differential pair transistors (pair transistors) 120 and 140 of cross-coupled type; 11(b) is a plan view showing a layout example in the case where the differential pair transistors 120 and 140 are formed of SiGe devices; and 11(c) is a plan view of a main portion showing an device active region 50 and its neighborhood in Embodiment 6.

FIG. 11(*a*) is a circuit diagram of differential pair transistors (pair transistors) 120 and 140 of a cross-coupled type. Generally speaking, in a differential circuit using differential pair transistors, circuit design is made on the premise that the transistors are completely equal in performance. Moreover, it is also necessary that the parasitic components (parasitic resistance and parasitic capacitance) are equal between them. Therefore, the arrangement and wiring layout of the transistors composing a differential pair are designed so as to be symmetrical.

FIG. 11(*b*) is a plan view showing a layout example in the case where the differential pair transistors 120 and 140 are formed of SiGe devices. An SiGe-containing layer (epitaxial layer) is grown on the two device active regions 50, and gate electrodes 15 are formed so as to lie across the epitaxial layer. The epitaxial layers 90 has source/drain regions formed therein, the source/drain regions being connected to a first wiring layer 23 through a plurality of contact regions which are formed in the epitaxial layer 90. The first wiring layer 23 is connected with a second wiring layer 24, and thus a circuit as shown in FIG. 11(*a*) is formed.

When forming such differential pair transistors from SiGe devices, it is desirable that the epitaxial layer 90 has an equal thickness between the pair of transistors 120 and 140.

In the present embodiment, as shown in FIG. 11(*c*), the shape and size of the two device active regions 50 in which the differential pair transistors 120 and 140 are formed are set so as to be equal, and these device active regions 50 are disposed symmetrically with respect to a line of symmetry 26. Moreover, the dummy regions 80 surrounding the device active region 50 are also arranged so as to be symmetrical with respect to the line of symmetry 26, and the dummy regions 80 in which epitaxial growth is performed are selected so as to be symmetrical with respect to the line of symmetry 26.

Thus, in the present embodiment, the growth of a pair of epitaxial layers used for forming differential pair transistors is performed in such a manner that symmetric flow and consumption of source gas will occur. As a result, there is an enhanced symmetry in the shape and thickness of the resultant epitaxial layers, whereby the performance of the differential pair transistors is improved.

FIGS. 12(*a*) and (*b*) each show an exemplary circuit including differential pair transistors. Vbias, Vbias1, Vbias2 and Vbias3 represent bias voltages to be applied to the circuit; and Vin and Vout represent an input voltage and an output voltage, respectively.

In these circuits, the transistors indicated by each arrow compose a pair, and need to be equal in performance. Therefore, in the case where the channel regions of the transistors composing each pair are to be formed in epitaxial layers, the epitaxial layers must be made symmetric in thickness.

According to the present embodiment, in the device active regions 50 in which epitaxial layers are to be grown, epitaxial layers are grown so as to realize high symmetry in the surroundings of the device active regions 50 in which the differential pair transistors are to be formed. Therefore, the characteristics of the differential pair transistors can be equalized.

EMBODIMENT 7

Still another embodiment of the semiconductor device according to the present invention will be described.

First, FIG. 13(*a*) will be referred to. In the example shown in FIG. 13(*a*), L-shaped dummy regions 80*a* are provided in positions adjoining four corners of a device active region 50 in which an SiGe device is formed, and an epitaxial layer is grown on the L-shaped dummy regions 80*b*.

In regions near the corners of the device active region 50, source gas is likely to be supplied from the outside, and the epitaxial layer is particularly likely to become thicker than in other portions. In order to suppress excessive flowing-in of source gas, it is preferable to place the L-shaped dummy regions 80*a* as shown in FIG. 13(*a*) in positions near the four corners of the device active region 50 and grow an epitaxial layer on these dummy regions 80.

In the example shown in FIG. 13(*b*), a plurality of gate electrodes 15 are formed so as to lie across an epitaxial layer 90 which is grown in a single device active region 50. Such gate electrodes 15 are referred to as "multi-finger-type gate electrodes". In order to reduce parasitic capacitance, no dummy regions 80 are formed below the regions where the gate electrodes 15 are formed.

In the example shown in FIG. 13(*b*), too, L-shaped dummy regions 80*a* are provided near the four corners of the device active region 50, and an epitaxial layer is grown on these dummy regions 80*a*.

EMBODIMENT 8

Still another embodiment of the semiconductor device according to the present invention will be described.

First, FIG. 14(*a*) is referred to. In the example shown in FIG. 14(*a*), C-shaped dummy regions 80*b* are provided in the neighborhood of a device active region 50 in which an SiGe device is formed, and an epitaxial layer is grown also on the C-shaped dummy regions 80*b*. The C-shaped dummy regions 80*b* are disposed so as to oppose, among the plurality of sides of the device active region 50, those sides which are parallel to the direction in which a gate electrode 15 extends. The C-shaped dummy regions 80 have two bent portions at both ends, where each bent portion surrounds a corresponding corner portion of the device active region 50.

FIG. 14(*b*) shows a device active region 50 in which an SiGe transistor having multi-finger-type gate electrodes 15 is formed, and its neighborhood. In the example shown in FIG. 14(*b*), too, C-shaped dummy regions 80*b* are provided, and an epitaxial layer is grown on the C-shaped dummy regions 80*b*.

EMBODIMENT 9

Still another embodiment of the semiconductor device according to the present invention will be described.

Figure 15:
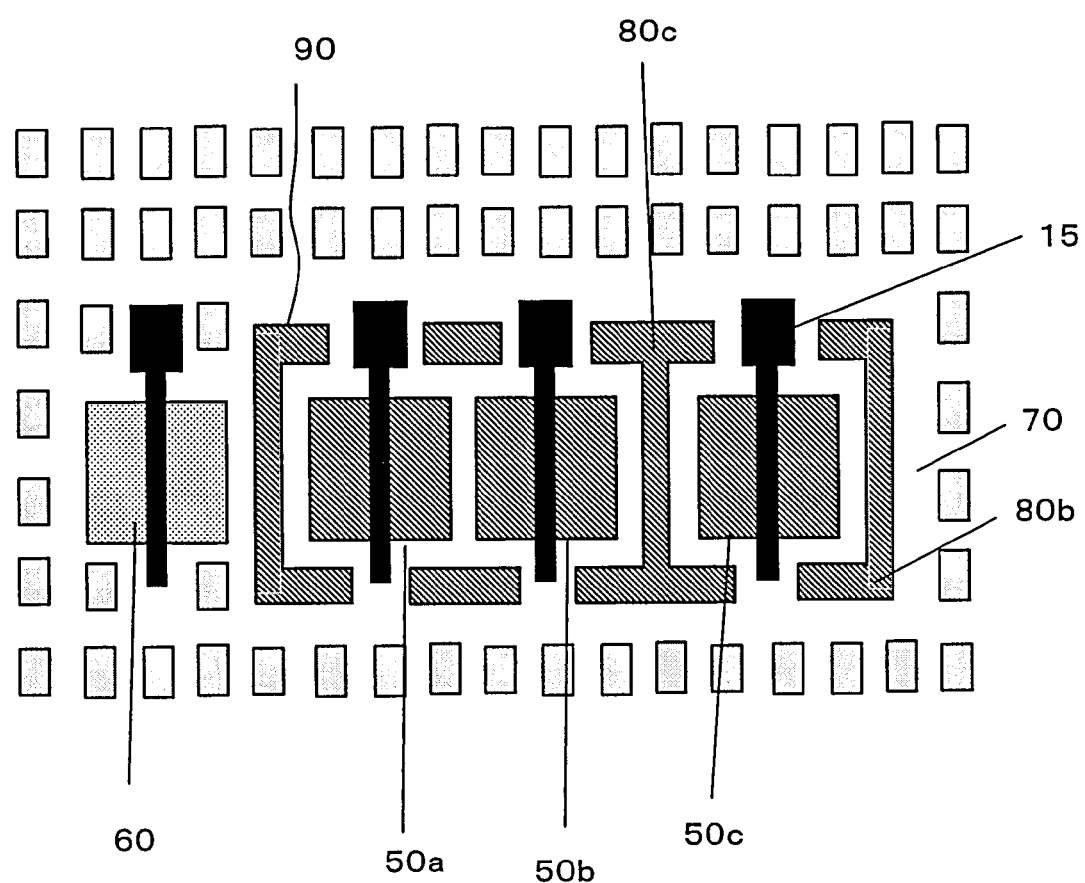
[FIG. 15] A main-portion plan view, showing an exemplary arrangement of an H-shaped dummy region in Embodiment 9.

First, FIG. 15 shows an example where a plurality of device active regions 50*a*, 50*b* and 50*c*, in which SiGe devices are formed, adjoin a device active region 60 in which an Si device is formed. Between the adjoining device active regions 50*a*, 50*b* and 50*c*, dummy regions 80 may or may not be provided. In the example shown in FIG. 15(*a*), an H-shaped dummy region 80c is provided between the device active region 50b and the device active region 50c, an epitaxial layer is grown also on the H-shaped dummy region 80c.

On the other hand, between the device active regions 50 in which SiGe devices are formed and the device active region 60 in which an Si device is formed, a C-shaped dummy region 80b is formed, and an epitaxial layer is grown also on the C-shaped dummy region 80b.

Although the device isolation structure is formed of STI in the above-described embodiments, the present invention is not limited thereto. Although dummy regions are formed for the suppression of dishing during CMP, in the case where a device isolation structure which does not employ CMP is adopted, the size, interval, density, and the like of the dummy regions can be set from the standpoint of optimizing the ratio of the Si surface during selective growth. In this case, the selective-growth mask only needs to surely cover only the device active regions in which Si devices are to be formed, whereby designing is facilitated.

Although a layer containing Si and Ge is grown as an epitaxial layer in each of the above embodiments, a layer containing Si and C (carbon) may be epitaxially grown, instead of a layer containing Si and Ge.

According to the present invention, the mask aperture ratio during selective growth is maintained within an appropriate range, so that a semiconductor layer in which Si devices and SiGe devices (or SiC devices) coexist can be provided with a good production yield.

INDUSTRIAL APPLICABILITY

According to the present invention, the mask aperture ratio during selective growth is maintained within an appropriate range, so that a semiconductor device in which Si devices and SiGe devices coexist can be provided with a good production yield.

The invention claimed is:

1. A production method for a semiconductor device, comprising:
    step (A) of providing a substrate including a semiconductor layer having a principal face, the substrate having a device isolation structure formed in an isolation region for partitioning the principal face into a plurality of device active regions;
    step (B) of growing an epitaxial layer containing Si and Ge, or Si and C, on selected device active regions among the plurality of device active regions of the principal face of the semiconductor layer; and
    step (C) of forming a field-effect transistor in, among the plurality of device active regions, each of the device active regions, wherein,
    step (A) comprises step (a1) of forming, in the isolation region, a plurality of dummy regions surrounded by the device isolation structure;
    step (B) comprises step (b1) of forming a selective-growth mask; step (b2) of growing a layer of the same material as that of the epitaxial layer on selected regions among the plurality of dummy regions; and step (b3) of removing the selective-growth mask; wherein the selective-growth mask has apertures over the selected device active regions among the plurality of device active regions and over the selected regions among the plurality of dummy regions, and completely covers at least some of the plurality of device active regions; and
    the plurality of device active regions, the plurality of dummy regions, and the selective-growth mask are formed in such a manner that a ratio of a total area of the plurality of device active regions and the plurality of dummy regions relative to a chip area is in a predetermined range and that an aperture ratio of the selective-growth mask for growing the epitaxial layer relative to the chip area is in a predetermined range.

2. The production method of claim 1, wherein, step (A) comprises:
    step (a2) of forming a trench on the principal face of the semiconductor layer;
    step (a3) of filling the trench with an insulator; and
    step (a4) of polishing and planarizing an upper face of the insulator, and
    a portion of the principal face of the semiconductor layer where the insulator does not exist includes the plurality of device active regions and the plurality of dummy regions,
    the semiconductor layer being exposed at a surface of the plurality of device active regions and the plurality of dummy regions.

3. The production method of claim 1, comprising, after step (b1) and before growing the epitaxial layer, a step of etching back a portion of the surface of the plurality of device active regions and the plurality of dummy regions where the semiconductor composing the semiconductor layer is exposed, from the surface.

4. The production method of claim 3, wherein the epitaxial layer is grown until the surface of the epitaxial layer becomes level with a surface of a portion of the semiconductor layer that has not been etched back.

5. The production method of claim 1, wherein step (B) comprises:
    a step of growing an Si epitaxial layer not containing Ge on the epitaxial layer containing Si and Ge or Si and C.

6. The production method of claim 1, wherein the field-effect transistors are MOS transistors.

7. The production method of claim 1, wherein the substrate is a monocrystalline Si substrate or an SOI substrate.

8. The production method of claim 1, wherein the selected regions among the plurality of dummy regions surround a device active region which is not covered by the selective-growth mask.

9. The production method of claim 1, wherein the selected regions among the plurality of dummy regions adjoin a device active region which is not covered by the selective-growth mask.

10. The production method of claim 1, wherein a device active region which is covered by the selective-growth mask adjoins a device active region which is not covered by the selective-growth mask, and at least one dummy region is provided between the two device active regions, the dummy region being not covered by the selective-growth mask.

11. The production method of claim 1, wherein an even number of device active regions in which field-effect transistors constituting a differential pair transistor circuit are formed exist as device active regions which are not covered by the selective-growth mask, and those dummy regions which are in symmetric positions with respect to an axis of symmetry of the even number of device active regions are not covered by the selective-growth mask.

12. The production method of claim 1, wherein an L-shaped dummy region is provided near a corner portion of a device active region which is not covered by the selective-growth mask, the L-shaped dummy region being not covered by the selective-growth mask.

13. The production method of claim 1, wherein at least one C-shaped dummy region is provided in the surroundings of a device active region which is not covered by the selective-growth mask, the C-shaped dummy region being not covered by the selective-growth mask.

14. The production method of claim 1, wherein an H-shaped dummy region is provided in a position interposed between a plurality of device active regions which are not covered by the selective-growth mask, the H-shaped dummy region being not covered by the selective-growth mask.

15. A semiconductor device, comprising:
- a substrate including a semiconductor layer having a principal face, the substrate having a device isolation structure formed in an isolation region for partitioning the principal face into a plurality of device active regions;
- an epitaxial layer containing Si and Ge, or Si and C, grown on selected device active regions among the plurality of device active regions of the principal face of the semiconductor layer, the epitaxial layer formed using a selective-growth mask having an aperture therein;
- a field-effect transistor formed in, among the plurality of device active regions, each of the device active regions
- a plurality of dummy regions formed in the isolation region and surrounded by the device isolation structure, wherein,
- a ratio of a total area of the plurality of device active regions and the plurality of dummy regions relative to a chip area is in a predetermined range and an aperture ratio of the selective-growth mask for growing the epitaxial layer relative to the chip area is in a predetermined range; and
- a layer of the same material as that of the epitaxial layer is provided on selected regions among the plurality of dummy regions.

16. The semiconductor device of claim 15, wherein the level of a surface of the device active regions in which the epitaxial layer is formed is lower than the level of a surface of the device active regions in which the epitaxial layer is not formed.

17. The semiconductor device of claim 16, wherein the level of a surface of the epitaxial layer is equal to the level of a surface of the device active regions in which the epitaxial layer is not grown.

18. The semiconductor device of claim 15, wherein, in a plurality of dummy regions provided in the surroundings of a device active region in which the epitaxial layer is grown, a layer of the same material as that of the epitaxial layer is formed.

19. The semiconductor device of claim 15, wherein, in each of a plurality of dummy regions adjoining a device active region in which the epitaxial layer is grown, a layer of the same material as that the epitaxial layer is formed.

20. The semiconductor device of claim 15, wherein,
- a device active region in which the epitaxial layer is not formed adjoins a device active region in which the epitaxial layer is formed, and
- at least one dummy region is provided between the two device active regions, a layer of the same material as that of the epitaxial layer being formed on the dummy region.

21. The semiconductor device of claim 15, wherein,
- an even number of device active regions in which field-effect transistors constituting a differential pair transistor circuit are formed exist as device active regions in which the epitaxial layer is formed, and
- a layer of the same material as that of the epitaxial layer is formed in those dummy regions which are in symmetric positions with respect to an axis of symmetry of the even number of device active regions.

22. The semiconductor device of claim 15, wherein,
- an L-shaped dummy region is provided near a corner portion of a device active region in which the epitaxial layer is formed, and
- a layer of the same material as that of the epitaxial layer is formed on the L-shaped dummy region.

23. The semiconductor device of claim 15, wherein,
- at least one C-shaped dummy region is provided in the surroundings of a device active region in which the epitaxial layer is formed, and
- a layer of the same material as that of the epitaxial layer is formed on the C-shaped dummy region.

24. The semiconductor device of claim 15, wherein,
- an H-shaped dummy region is provided in a position interposed between a plurality of device active regions in which the epitaxial layer is formed, and
- a layer of the same material as that of the epitaxial layer is formed on the H-shaped dummy region.

* * * * *